(12) United States Patent
Preikszas et al.

(10) Patent No.: US 8,304,750 B2
(45) Date of Patent: Nov. 6, 2012

(54) SCANNING CHARGED PARTICLE BEAMS

(75) Inventors: Dirk Preikszas, Oberkochen (DE);
Michael Steigerwald, Westhausen (DE);
Joerg Ackermann, Crimmitschau (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 222 days.

(21) Appl. No.: 12/744,152

(22) PCT Filed: Dec. 12, 2008

(86) PCT No.: PCT/EP2008/067419
§ 371 (c)(1),
(2), (4) Date: Aug. 16, 2010

(87) PCT Pub. No.: WO2009/077450
PCT Pub. Date: Jun. 25, 2009

(65) Prior Publication Data
US 2010/0294930 A1  Nov. 25, 2010

Related U.S. Application Data

(60) Provisional application No. 61/014,229, filed on Dec. 17, 2007.

(51) Int. Cl.
*H01J 37/302* (2006.01)
(52) U.S. Cl. .................. 250/492.22; 250/398

(58) Field of Classification Search ............ 250/492.22, 250/492.23, 398
See application file for complete search history.

(56) References Cited

U.S. PATENT DOCUMENTS

| | | | |
|---|---|---|---|
| 6,566,662 B1 | 5/2003 | Murakami et al. | |
| 6,635,549 B2 * | 10/2003 | Kyoh et al. ................ | 430/5 |
| 6,855,938 B2 | 2/2005 | Preikszas et al. | |
| 7,105,814 B2 | 9/2006 | Knippelmeyer | |
| 7,186,976 B2 | 3/2007 | Dean et al. | |
| 2003/0022078 A1 | 1/2003 | Hamamoto et al. | |
| 2007/0114454 A1 | 5/2007 | Kozakai et al. | |
| 2007/0138388 A1 | 6/2007 | Ward et al. | |
| 2007/0158558 A1 | 7/2007 | Ward et al. | |
| 2011/0049364 A1 * | 3/2011 | Knippelmeyer et al. ..... | 250/307 |

FOREIGN PATENT DOCUMENTS

| | | |
|---|---|---|
| EP | 1 045 425 | 10/2000 |
| EP | 1 271 605 | 1/2003 |
| EP | 1 389 795 | 2/2004 |
| JP | 6-038329 | 5/2004 |
| WO | WO 2007/008792 | 1/2007 |

* cited by examiner

*Primary Examiner* — Kiet T Nguyen
(74) *Attorney, Agent, or Firm* — Fish & Richardson P.C.

(57) ABSTRACT

Methods are disclosed that include exposing, in direct succession, portions of a surface of a sample to a charged particle beam, the portions of the surface of the sample forming a row in a first direction, the charged particle beam having an average spot size f at the surface of the sample, each portion being spaced from its neighboring portions by a distance of at least d in the first direction, and a ratio d/f being 2 or more.

30 Claims, 15 Drawing Sheets

SCANNING CHARGED PARTICLE BEAMS

CROSS-REFERENCE TO RELATED APPLICATIONS

This application is the National Stage of International Application No. PCT/EP2008/067419, filed Dec. 12, 2008, which claims the benefit of U.S. Provisional Application Ser. No. 61/014,229, filed Dec. 17, 2007.

TECHNICAL FIELD

This disclosure relates to charged particle sources, systems, and methods.

BACKGROUND

Ions can be formed using, for example, a liquid metal ion source or a gas field ion source. In some instances, ions formed by an ion source can be used to determine certain properties of a sample that is exposed to the ions, or to modify the sample. In other instances, ions formed by an ion source can be used to determine certain characteristics of the ion source itself.

SUMMARY

In general, in a first aspect, the disclosure features a method that includes exposing, in direct succession, portions of a surface of a sample to a charged particle beam, the portions of the surface of the sample forming a row in a first direction, the charged particle beam having an average spot size f at the surface of the sample, each portion being spaced from its neighboring portions by a distance of at least d in the first direction, and a ratio d/f being 2 or more.

In another aspect, the disclosure features a method that includes exposing a sample to a charged particle beam having an average spot size f at a surface of the sample by displacing the charged particle beam and the sample relative to one another so that the charged particle beam forms a plurality of exposure lines on the surface of the sample, where each successive exposure line comprises a plurality of exposure spots and is spaced from previous exposure lines by a distance of at least d measured along a first direction and a ratio d/f is 2 or more, and where the sample and the charged particle beam are positioned within a common chamber having a gas pressure less than $10^{-2}$ Torr and a plurality of particles leaving the sample are detected by a detector positioned within the common chamber.

In a further aspect, the disclosure features a method that includes: (a) determining a side length $F \cdot \sqrt{A}$ of a smallest square that encloses a region of a sample, where A is an area of the region and F is a constant; and (b) exposing each of M portions of the region of the sample to a charged particle beam, where each of the M portions is exposed continuously to the charged particle beam for a time period $t_1$, a shortest time period between successive exposures of any one of the M portions to the charged particle beam is $t_2$, and the time periods $t_1$ and $t_2$ are selected so that a ratio $$\frac{t_1}{t_1 + t_2}$$

is less than $$\frac{1}{2F\sqrt{M}}.$$

Embodiments can include one or more of the following features.

The method can include exposing, in direct succession, a second plurality of portions of the surface of the sample to the charged particle beam, each portion of the second plurality of portions being spaced from its neighboring portions in the second plurality of portions by a distance of at least d in the first direction and being spaced from the first portions by a distance of at least e in a second direction orthogonal to the first direction.

The sample and the charged particle beam can be positioned within a common chamber having a gas pressure less than $10^{-2}$ Torr, and a plurality of particles leaving the sample can be detected by a detector positioned within the common chamber.

The sample can be positioned on a sample mount that permits translation of the sample in a plane orthogonal to a direction of incidence of the charged particle beam, and the mount can be configured to permit exchange of the sample for another sample.

The sample can be positioned on a sample mount, and the sample mount can be configured to permit adjustment of a distance between the sample and a lens of a charged particle lens system that directs that charged particle beam to be incident on the sample.

A ratio e/f can be 2 or more (e.g., 3 or more, 4 or more, 5 or more, 7 or more, 10 or more, 20 or more, 30 or more, 50 or more, 70 or more, 100 or more). The quantity e can be greater than or equal to d.

The method can include forming an image of the sample based on a plurality of particles leaving the sample. The method can include displaying the image of the sample to a system operator on an electronic display unit.

The method can include exposing the sample to an electron source prior to exposing the sample to the charged particle beam. Alternatively, or in addition, the method can include exposing the sample to an electron source during exposure of the sample to the charged particle beam.

A charged particle current of the charged particle beam can be 10 pA or more (e.g., 20 pA or more, 30 pA or more, 40 pA or more, 50 pA or more, 70 pA or more, 100 pA or more, 150 pA or more, 200 pA or more, 500 pA or more).

Each portion can be exposed to the charged particle beam for an exposure time of 100 µs or less (e.g, 80 µs or less, 60 µs or less, 40 µs or less, 30 µs or less, 20 µs or less, 10 µs or less, 5 µs or less, 1 µs or less, 0.5 µs or less, 0.1 µs or less).

A charged particle current of the charged particle beam can be 1 pA or more, each of the portions can be exposed to the charged particle beam for an exposure time of 100 µs or less, and the image can be formed over a total acquisition time of 100 seconds or less.

The charged particle beam can include noble gas ions. The noble gas ions can include helium ions.

The charged particle beam can include electrons.

The value of f can be 5 nm or less (e.g., 4 nm or less, 3 nm or less, 2 nm or less, 1 nm or less, 0.5 nm or less).

The value of d can be 10 nm or more (e.g., 20 nm or more, 30 nm or more, 40 nm or more, 50 nm or more, 70 nm or more, 100 nm or more, 200 nm or more, 300 nm or more, 500 nm or more).

The value of e can be 10 nm or more (e.g., 20 nm or more, 30 nm or more, 40 nm or more, 50 nm or more, 70 nm or more, 100 nm or more, 200 nm or more, 300 nm or more, 500 nm or more).

The charged particle beam can have an energy spread at the surface of the sample of five eV or less (e.g., four eV or less, three eV or less, two eV or less, one eV or less, 0.5 eV or less, 0.1 eV or less).

A resolution of the image can be three nm or less (e.g., two nm or less, one nm or less, 0.5 nm or less, 0.25 nm or less, 0.1 nm or less).

The plurality of particles can include secondary electrons. The plurality of particles can include at least one member of the group consisting of scattered ions and scattered neutral atoms. The plurality of particles can include photons.

The charged particle beam can be produced by a gas field ion microscope having a quality factor of 0.25 or more (e.g., a quality factor of 0.5 or more, a quality factor of 1 or more, a quality factor of 2 or more, a quality factor of 3 or more, a quality factor of 5 or more, a quality factor of 10 or more).

Each of the portions can include multiple image pixels.

The method can include heating the sample during exposure to the charged particle beam.

The charged particle beam can have a reduced brightness at the surface of the sample of $5 \times 10^8$ A/m$^2$srV or more (e.g., $1 \times 10^9$ A/cm$^2$srV or more, $1 \times 10^{10}$ A/cm$^2$srV or more).

The exposure lines can extend along a second direction orthogonal to the first direction.

The ratio d/f can be 10 or more.

The charged particle beam can expose regions of the sample corresponding to each of the exposure lines the same number of times before the charged particle beam exposes any of the regions a larger number of times.

The charged particle beam can expose regions of the sample corresponding to a first subset of exposure lines to form a first image frame, and the charged particle beam can expose regions of the sample corresponding to a second subset of exposure lines to form a second image frame, and the image can be formed by combining the first and second image frames.

Each exposure line can have an average thickness g measured along the first direction, and a ratio d/g can be 2 or more (e.g., 3 or more, 4 or more, 5 or more, 7 or more, 10 or more, 20 or more, 50 or more, 100 or more).

The charged particle beam can first expose regions of the sample corresponding to a first portion of each of the exposure lines, and then the charged particle beam can expose regions of the sample corresponding to a second portion of each of the exposure lines.

The ratio $$\frac{t_1}{t_1 + t_2}$$

can be less than $$\frac{1}{4F\sqrt{M}} (e.g.,$$

less than $$\frac{1}{6F\sqrt{M}},$$

less than $$\frac{1}{8F\sqrt{M}},$$

less than $$\frac{1}{10F\sqrt{M}}).$$

Determining the side length of the smallest square can include determining a maximum dimension of the region.

The method can include exposing, in direct succession, a first plurality of the M portions to the charged particle beam, the first plurality of portions forming a row in a first direction, the charged particle beam having an average spot size f at a surface of the sample, each portion of the first plurality of portions being spaced from its neighboring portions by a distance of at least d in the first direction, and a ratio d/f being 2 or more.

The method can include exposing, in direct succession, a second plurality of the M portions to the charged particle beam, the second plurality of portions forming a row in the first direction parallel to the row formed by the first plurality of portions, each portion of the second plurality of portions being spaced from its neighboring portions in the second plurality of portions by a distance of at least d in the first direction and being spaced from the first plurality of portions by a distance of at least e in a second direction orthogonal to the first direction.

The value of e can be larger than the value of d.

The value of f can be 5 nm or less, the value of d can be 10 nm or more, and the value of e can be 10 nm or more.

Embodiments can include one or more of the following advantages.

In some embodiments, relatively high ion beam currents can be used when exposing a sample to the ion beam. By implementing a scanning protocol in which portions of the sample are exposed to the ion beam relatively infrequently, implanted particles can diffuse out of the exposed portions before the ion beam returns to re-expose the portions. As a result, relatively high ion beam currents do not lead to saturation of implanted ions within the sample. High ion beam currents typically yield better images of the sample than low ion beam currents, because the signal-to-noise ratio in images obtained using high ion beam currents is larger.

In certain embodiments, longer exposure times per portion of the sample can be used when exposing a sample to the ion beam. By implementing a scanning protocol in which portions of the sample are exposed to the ion beam relatively infrequently, diffusion of implanted particles out of the exposed portions can occur before the ion beam returns to re-expose the portions. Longer exposure times therefore do not lead to saturation of the sample with implanted particles. Higher quality images of the sample are obtained with longer exposure times due to higher signal-to-noise ratios in measured signals.

In some embodiments, sample charging is reduced when the sample is exposed to an ion beam under a suitably chosen scanning protocol. Insulating samples in particular dissipate excess charge introduced into the sample (e.g., at the surface of the sample) via the ion beam by diffusive conduction of the excess charge to a charge sink. By using a scanning protocol in which portions of the sample are exposed to the ion beam relatively infrequently, excess charge can diffuse out of the portions before the ion beam returns to re-expose the portions. Excess charge can lead to imaging artifacts that arise due to modified interactions between incident ions and the sample. Therefore, implementation of a suitable scanning protocol can improve the quality of images of the sample obtained via exposure of the sample to the ion beam.

In certain embodiments, suitable scanning protocols enable rough information to be obtained quickly from a sample, and allow more detailed information to be obtained more slowly. For example, scanning protocols that follow a "checkerboard" pattern can be used to quickly obtain a low-resolution image of a sample by exposing the sample to the ion beam in a series of well-spaced exposure spots. Large-scale information (e.g., identification of large surface features) can be obtained from a single exposure of the sample to the ion beam. This information can be used to locate particular features of the sample, for example, prior to performing a higher-resolution exposure of the sample to the ion beam. The combination of a low-resolution initial exposure and higher-resolution subsequent exposures of the sample enables significantly faster imaging of the sample than would be possible with only high-resolution exposures.

The details of one or more embodiments are set forth in the accompanying drawings and the description below. Other features and advantages will be apparent from the description, drawings, and claims.

DESCRIPTION OF DRAWINGS

Like reference symbols in the various drawings indicate like elements.

DETAILED DESCRIPTION

Figure 1:
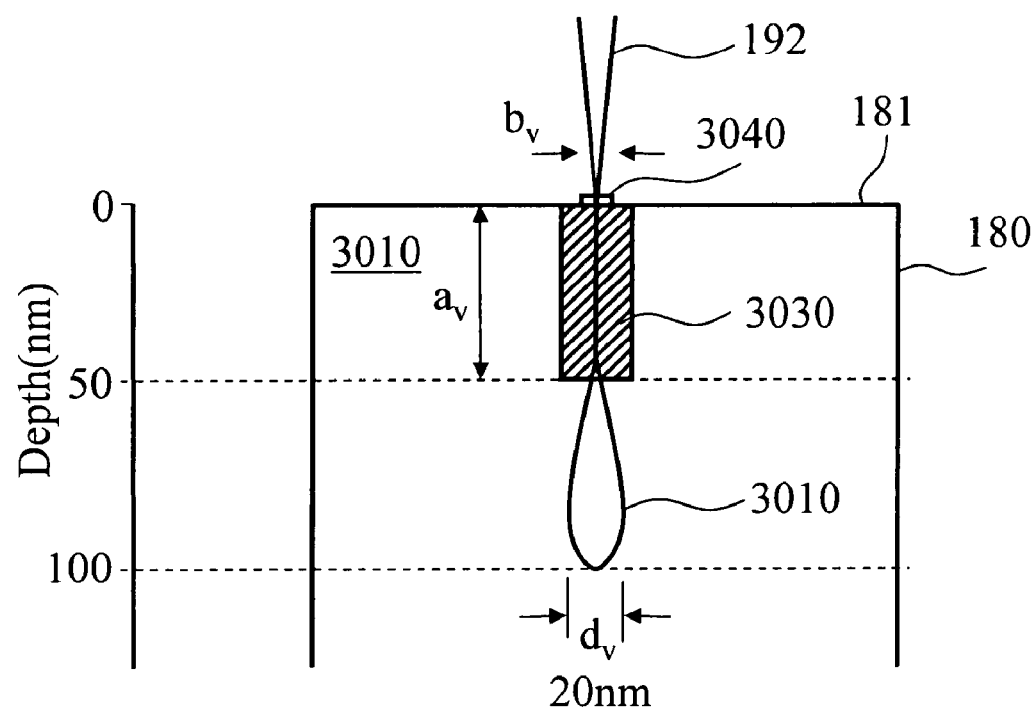
FIG. 1 is a schematic cross-sectional diagram showing particle implantation in a sample.

Ion beams can be used for a variety of applications, including exposing samples for purposes of sample imaging or modification. Sample imaging typically includes directing an ion beam to be incident on a surface of the sample, and then detecting particles that leave the sample in response to the incident ion beam. In particular, the ion beam is typically scanned over a surface of the sample to generate the particles, and measured signals corresponding to the detected particles are correlated with the spatial location of the incident ion beam to form images of the sample.

In scanning ion microscope systems, damage to the sample which can occur resulting from ion sputtering by the incident ion beam can introduce limitations to the achievable spatial resolution of imaging techniques. The amount of damage due to ion sputtering is generally related to the fluence of the ion beam (e.g., the number of ions per unit area incident on the sample). To measure high-resolution images of the sample, sufficiently large numbers of incident ions are required to detect particles with an acceptable signal-to-noise ratio. If the ion beam current is reduced, damage to the sample due to ion sputtering as a function of time is typically reduced. However, to obtain images of the sample which are not too noisy to be of use, the image acquisition time (and the exposure time for each exposed portion of the sample) may have to be increased. The sample can suffer accumulated damage as a result of the increased acquisition time.

As an example, gallium ion beams are typically used for machining of samples. Due to their relatively large masses, gallium ions have large sputter rates for most samples. The smallest resolvable detail in images formed by exposing typical semiconductor samples to a gallium ion beam has a dimension of about 5 nm due to the gallium ion beam's tendency to mill the surface of the sample if it is focused too tightly at the point of incidence.

Ion beams based on lighter ions such as helium ions typically have much lower sputter rates than gallium ion beams. As a result, the amount of sample damage due to exposure to a helium ion beam is smaller than the amount of damage that arises from a gallium ion beam of the same ion beam current. The smallest resolvable detail in images formed by exposing samples to the helium ion beam can be less than 5 nm—in some cases, much less than 5 nm.

Thus, when the ion beam is a helium ion beam or a similar ion beam formed of relatively light ions, ion sputtering of the sample may not be a significant problem during sample imaging. However, the inventors have recognized that ion sputtering is not the only mechanism that can lead to damage of the sample and poor image quality, and that depending upon the incident ion energy and the material of the sample, sub-surface helium bubbles can be formed in the sample, and the sample can start to disintegrate.

Sample charging can also occur as a result of the incident ion beam. Incident ions can produce secondary charged particles (e.g., electrons and/or ions). Some incident ions can also be implanted within the sample as ions rather than as neutral atoms. As a result, an excess of charge can build up in the sample, and particularly at the surface of the sample and in the region adjacent thereto. If the sample has relatively high conductivity (e.g., a metal), the excess charge can be dissipated relatively quickly to a sink (e.g., an electrical ground). However, for insulating samples, charge tends to accumulate near the surface of the sample where the ion beam is incident, producing a surface capacitance which increases until the voltage at the surface is large enough to induce conduction of the excess charge to ground or to adjacent insulating sample regions. Accumulated surface charge produces electric fields at the surface of the sample. These local fields can affect interactions between the incident ions and the sample surface (e.g., by deflecting the incident ion beam), and can also affect generation of secondary particles in the sample. As a result, images of the sample that are obtained by measuring the secondary particles can be degraded.

The inventors have also recognized that damaging effects due to ion beam interactions with the sample, including ion implantation and/or charge accumulation, are a function not only of the ion beam fluence (e.g., incident ions per unit area), but are also rate-dependent. That is, relatively slow exposure of a sample to the incident ion beam typically leads to a smaller degree of sample damage than faster exposure to the ion beam.

Without wishing to be bound by theory, it is believed that the reasons for this are related to the reversibility of particle implantation and charge accumulation that can lead to sample damage. For example, particles implanted within the sample can diffuse out of the sample, returning the sample to its original non-implanted internal structure. Diffusion of implanted particles occurs relatively slowly and as a result, scanning protocols that include relatively long intervals between successive exposures of a given portion of the sample to the ion beam allow for diffusion of the implanted particles out of the sample between exposures, thereby reversing some of the effects of implantation.

As another example, dissipation of excess charge in an insulating sample typically also occurs via diffusion from an exposed portion of the sample surface to another portion with a smaller quantity of excess charge (or no excess charge). As a result, for insulating samples, scanning protocols that include relatively long intervals between successive exposures of a given portion to the ion beam allow for greater excess charge dissipation, and thereby mitigate degradation in image quality that can otherwise result from sample charging.

To avoid damage to the sample and image quality degradation, the scanning protocols disclosed herein ensure that the ion beam does not expose the same portion of the sample for too long during a single exposure. Instead, if a relatively long total exposure time for a particular portion is required, the ion beam revisits the portion multiple times to perform a series of short-duration exposures. The exposure time of the ion beam at each of the exposed portions of the sample is altered so that the acquisition of individual image pixels occurs over an aggregate exposure time that is approximately the same as the single-exposure time. However, the incident ion beam current is distributed over a larger region of the sample. In addition, the scanning protocols disclosed herein ensure that a significant amount of time elapses between successive exposures of a particular portion of the sample to the ion beam to allow for particle diffusion out of the exposed portions and charge dissipation, thereby reducing local electric fields in the sample between ion beam exposures.

In addition, the scanning protocols disclosed herein can be used when the ion beam interacts with a surface region of sample upon which one or more chemical agents have been adsorbed. Surface-adsorbed chemical agents can interact with secondary electrons produced by the ion beam to induce one or more chemical reactions in the sample, for example, which can be used to achieve controlled structural modification of the sample. As the adsorbed chemical agents are consumed during a reaction, they can be replenished by, for example, a gas nozzle positioned to deliver additional quantities of the agents to the surface of the sample in the vicinity of the position of the ion beam. The position of the gas nozzle can change as the position of the ion beam changes (e.g., the gas nozzle can follow the ion beam in a regular pattern across the surface of the sample).

Active chemical agents delivered by the gas nozzle are typically adsorbed onto the surface of the sample. If the ion beam scans the surface of the sample in a simple line-by-line raster pattern, the ion beam always interrogates portions of the sample surface (e.g., ion beam spots) where the adsorbed chemical agents have already been depleted due to interactions with the ion beam positioned in a prior, adjacent location (e.g., beam spot). However, when the ion beam is scanned according to the scanning protocols disclosed herein, sequential beam spots are spaced from one another by a larger amount than in conventional raster scanning protocols. As a result, at each position of the ion beam on the surface of the sample, the adsorbed chemical agents have not yet interacted with secondary electrons produced by the ion beam or, alternatively, the adsorbed chemical agents have been replenished following a previous interaction with secondary electrons produced by the ion beam. Accordingly, the efficiency of ion beam-induced chemistry at the sample is typically enhanced by scanning the sample surface with the ion beam according to the scanning protocols disclosed herein, so that the interval between successive exposures of any region of the sample is relatively long.

Certain samples can also include undesired adsorbed chemical agents that are present on the surface of such samples. The chemical agents can be by-products of ion beam-induced chemical reactions in the sample, and can include, for example, various hydrocarbon species. By scanning the ion beam over the sample surface according to the scanning protocols disclosed herein, the effects of contamination due to these undesired chemical agents can be reduced.

This disclosure is divided into two parts. In part I, scanning protocols for ion beams are disclosed. In part II, ion beam systems for generating and manipulating ion beams are disclosed.

I. Ion Beam Scanning Protocols

Figure 19A:
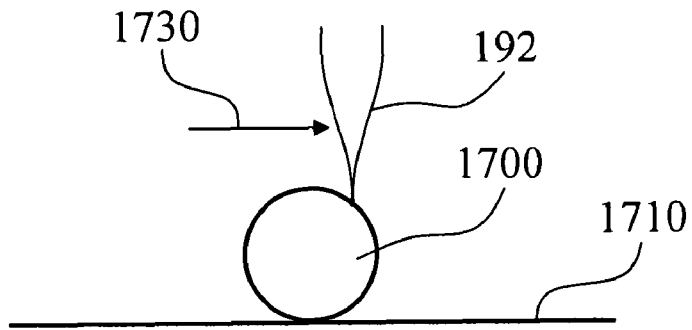
FIGS. 19A and 19B are side and top views of a gold island supported by a carbon surface.

In a preliminary study, a sample that included a carbon substrate with a gold island formed thereon was exposed to a He ion beam. A schematic diagram of the island 1700 atop carbon surface 1710 is shown in FIG. 19A. The gold island can be formed, for example, by vapor deposition of gold onto carbon surface 1710. Measurement samples that include gold islands deposited on carbon, suitable for the measurements described herein, are available commercially from Structure Probe Inc. (West Chester, Pa.), for example.

A He ion microscope was operated such that an ion beam 192 was scanned over a surface of the gold island, and an image of the sample was obtained by detecting secondary electrons leaving the surface of the sample in response to the incident ion beam. The scanned region of the sample was square, with a side length of one micron, and included an array of 500×500 pixels. The He ion beam energy was 25 keV, and the He ion beam current was 1 pA. Each exposure spot on the sample formed by the ion beam corresponded to one image pixel, and the exposure time for each spot was set to 100 µs. The total exposure time for the sample region was 25 s. A relatively noise-free image of the sample was obtained, and no sample damage was apparent following image acquisition.

In a second study, the scanned region of the sample was reduced in size to a square area with a side length of 100 nm, while maintaining the ion beam current at 1 pA. Under these conditions, the ion beam fluence was increased by a factor of 25. Images of the sample showed that the gold island, which had a thickness of approximately 100 nm, was completely removed down to the carbon substrate. The inventors recognized that, given the relatively low ion beam current and the relatively low sputter rate of He ions, the damage to the sample was not due primarily to ion sputtering. Furthermore, in a subsequent study, a series of images of a second sample similar to the first sample were measured for a square scanned region of side length 1 µm, and with an ion beam current of 1 pA. The images were measured for 100 successive scans of the sample. Under these conditions, the ion beam fluence was increased by a factor of 100; however, no damage to the sample was apparent from the images obtained.

Without wishing to be bound by theory, it is believed that when the He ion beam is incident on the gold sample at an energy of 25 keV, most of the helium ions are implanted in a region of the sample that is positioned from about 50 nm through to about 100 nm below the surface of the sample upon which the ion beam is incident. FIG. 1 shows a schematic cross-sectional diagram of a sample 180 formed of gold, as discussed above. Ion beam 192 is incident upon surface 181 of sample 180. Ions from ion beam 192 are implanted in region 3010 of sample 180, which extends from a depth of approximately 50 nm to a depth of approximately 100 nm below surface 181. As shown in FIG. 1, a width $d_v$ of region 3010 is approximately 20 nm for the exposure conditions.

Diffusion of implanted ions in region 3010 can occur through region 3020 of sample 180 to reach surface 181, where the ions can then leave sample 180 via outgassing. To obtain numerical guidelines for exposure of samples to the ion beams disclosed herein, calculations were performed on an interaction region 3030 of the sample with a cross-sectional area that is 20 nm×20 nm (e.g., the approximate cross-sectional area of region 3010 in a plane parallel to surface 181 of sample 180), and with a height of 50 nm (e.g., the depth of region 3020 below surface 180).

Sample 180, which is formed of gold, includes $$\frac{\rho_{Au} \cdot a_v \cdot d_v^2}{m_{Au}} \approx 1.2 \times 10^6$$

gold atoms in interaction region 3030, where $\rho_{Au}$ is the bulk density of gold, $a_v$=50 nm is the height of region 3030, and $m_{Au}$ is the mass of a gold atom. Helium is soluble in gold at room temperature up to a molar concentration of about 0.5%. Accordingly, if a concentration of more than $M_b \approx 6000$ He particles (e.g., atoms and/or ions) are present in region 3030, He bubbles begin to grow in the region. The critical He ion fluence in materials for disintegration is known from simulations of fusion reactors to be about $F_c \approx 10^{20}$ particles m$^{-2}$, which imposes a critical limit of $M_c = F_c \cdot d_v^2 \approx 40000$ He particles in region 3030 before blisters and sample damage occur.

Diffusion of implanted He particles occurs in region 3030. When the total concentration of He particles in region 3030 exceeds $M_b \approx 6000$ particles, a concentration gradient in region 3030 forms via diffusion. The gradient is approximately linear in He concentration from a depth of 50 nm (e.g., the lower edge of region 3030) to surface 181 (e.g., the upper edge of region 3030). The diffusion constant for He particles in gold is known to be $D \approx 2 \times 10^{-13}$ m$^2$s$^{-1}$, so that a maximum diffusion rate, Rb, according to Fick's first law of diffusion, is given by $$R_b = D \cdot \frac{M_b}{a_v \cdot d_v^2} \cdot \frac{1}{h_g} = 1200 \text{ particles nm}^{-2} \, s^{-1}$$

where $h_g$=50 nm is the length of the diffusion gradient.

During exposure of sample 180 to ion beam 192, the ion beam current is approximately $C_i$=6×10$^6$ ions/s. For an exposed surface region 3040 having a side length $b_v$=100 nm and including an array of 500×500 pixels, and exposed to the ion beam for an exposure time $t_c$=100 µs per pixel, the number of He particles $M_{He}$ implanted in region 3030, allowing for diffusion, is at least $$M_{He} > (C_{He} - R_b \cdot d_v^2) \cdot 500 \cdot \frac{d_v}{b_v} \cdot t_e \approx 55000 \text{ particles}$$

That is, the number of helium particles $M_{He}$ in region 3030 is significantly higher than the critical limit of $M_c \approx 40000$ particles. Thus, the gold surface of sample 180 bubbles and blisters, and eventually bursts away, producing the observed sample damage.

However, if the exposed surface region 3040 has a side length of $b_v$=1 µm under otherwise similar conditions, then $M_{He}$ is reduced to approximately 6000 particles, which is well below the critical limit $M_c$. As a result, sample damage is generally avoided. The difference between the two sets of exposure conditions arises from increased outgassing of implanted He particles under the second set of exposure conditions.

Thus, He ions can be implanted into a subsurface region 3040 of sample 180 up to a certain concentration limit, beyond which sample damage occurs. The concentration of implanted He particles is slowly lowered by diffusion of the particles toward surface 181, where the particles leave sample 180. If sample 180 is insulating, excess charge accumulates near surface 181 during exposure to ion beam 192, with similar consequences. Charge can be capacitively accumulated up to a certain surface voltage limit, beyond which interactions of ions from ion beam 192 with sample 180 are severely disrupted, degrading the quality of images derived from measurements of particles leaving sample 180. The accumulated surface charge can be lowered, relatively slowly, by small leakage currents that conduct charge to other insulating regions of sample 180. Based on the foregoing considerations, scanning protocols that reduce sample damage from incident ions also help to mitigate surface charging of the sample.

Helium ion microscope systems can interrogate samples with angstrom resolution. Typically, the microscope systems are configured to operate with relatively small fields of view on the order of 100 nm on each side. Based on the discussion above, sample damage due to particle implantation can be a significant problem in He ion microscope systems. During operation, the ion beam current can be reduced to help mitigate sample damage. However, it has been discovered that under typical operating conditions, a lower limit of about 600 incident ions per image pixel are needed to obtain images with acceptable signal-to-noise ratios. Thus, with low operating ion beam currents, the total image acquisition time can be very long. Long acquisition times increase the influence of sample drift on the measured images, and the relatively weak detector signals generally suffer greater perturbations due to detector noise.

Figure 2:
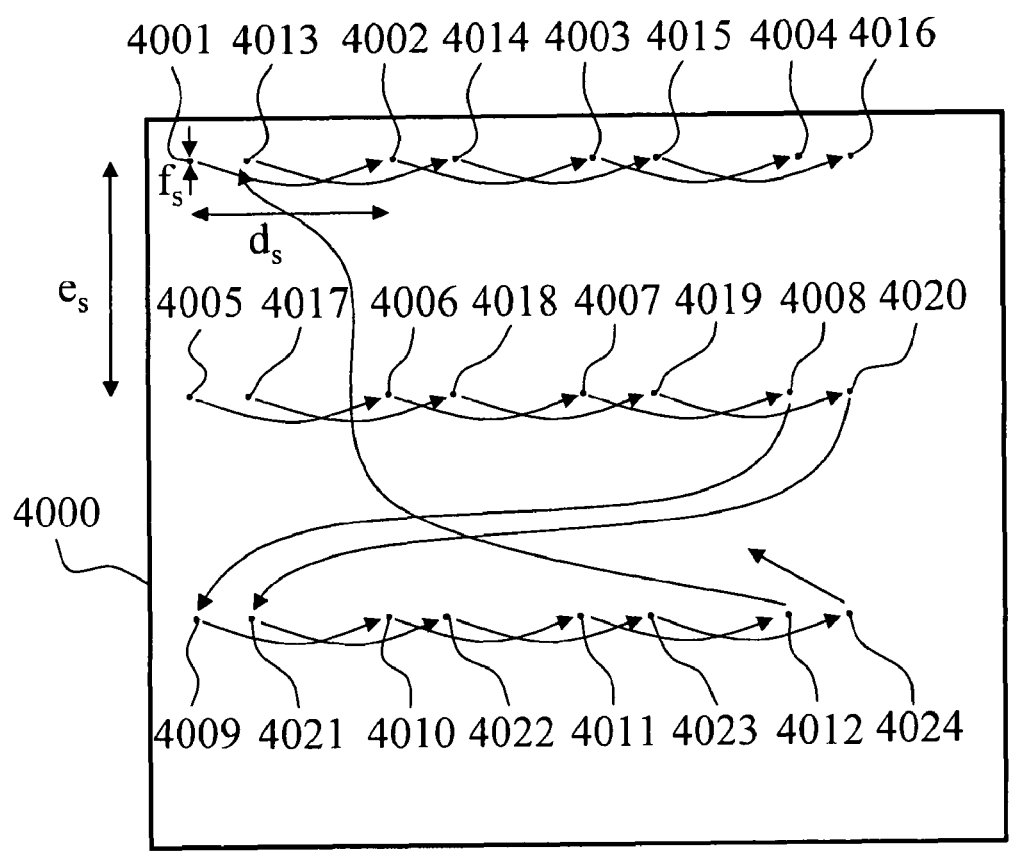
FIG. 2 is a schematic diagram showing an view of a scanning protocol for an ion beam.

An embodiment of a scanning protocol that permits relatively high ion beam currents while at the same time mitigating sample damage and charging due to the incident He ions is shown schematically in FIG. 2. Region 4000 is a region of sample 180 that is exposed to ion beam 192 in a particular exposure pattern defined by the scanning protocol. The scanning protocol illustrated in FIG. 2 is referred to as a checkerboard scanning protocol due to the order in which different spatial portions of region 4000 are exposed to ion beam 192.

Figure 3:
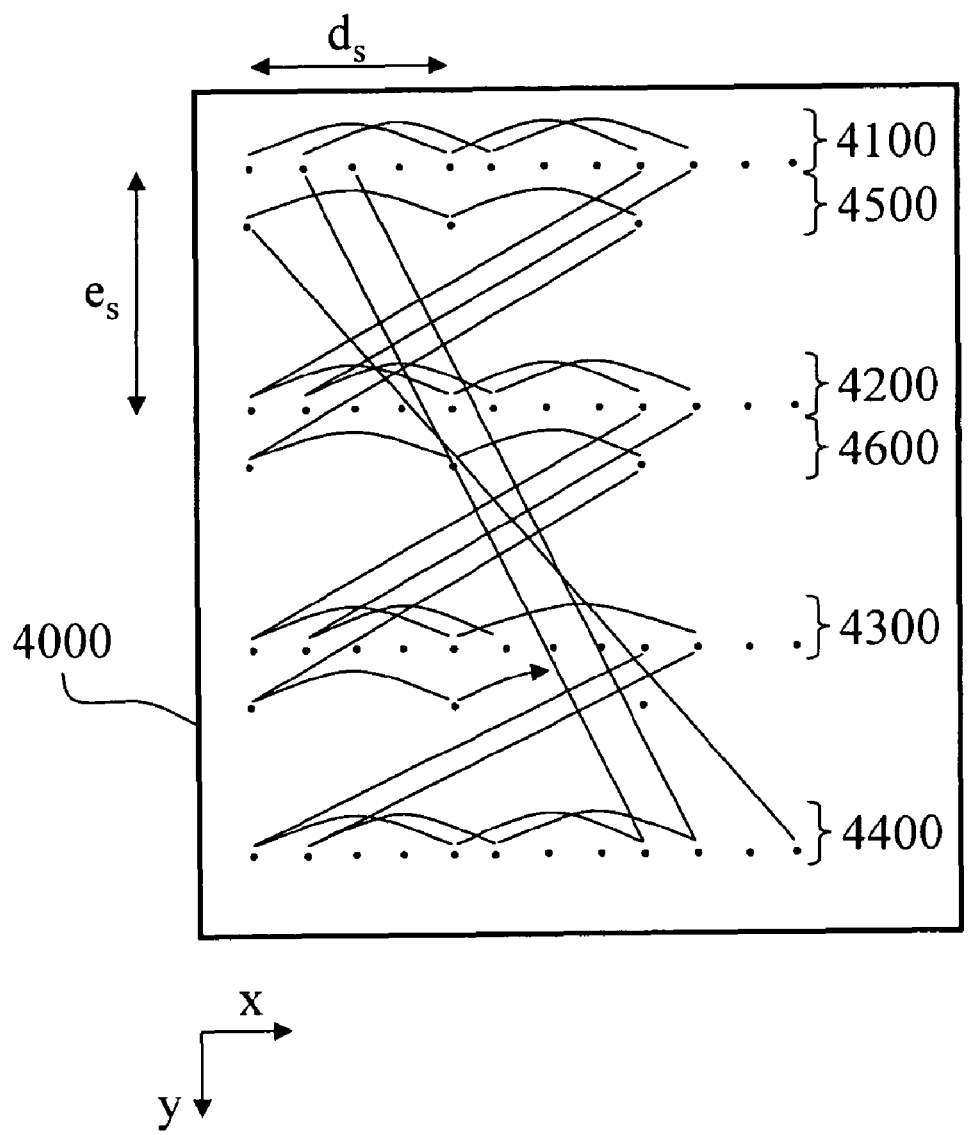
FIG. 3 is a schematic diagram showing another view of the scanning protocol of FIG. 2.

During exposure of region 4000, ion beam 192 and sample 180 are translated relative to one another (e.g., either by moving ion beam 192 or by moving sample 180, or both) to alternately expose different portions of region 4000. In FIG. 2, ion beam 192 forms a plurality of exposure spots 4001-4024 on region 4000. Only a subset of the exposure spots are shown in FIG. 2 for clarity. In FIG. 3, additional exposure spots are shown for the same checkerboard scanning protocol to provide a more complete picture of the order in which the various portions of region 4000 are exposed.

Returning to FIG. 2, ion beam 192 has an average spot size $f_s$ at the surface of region 4000. To begin scanning region 4000, ion beam 192 is positioned with respect to region 4000 so that the portion of region 4000 corresponding to exposure spot 4001 is exposed to ion beam 192. Following exposure of spot 4001, ion beam 192 is re-positioned relative to region 4000 by translating ion beam 192 a distance $d_s$ in the x-direction, and the portion of region 4000 corresponding to exposure spot 4002 is exposed to ion beam 192. The re-positioning and exposing continues until spots 4001-4004 have been exposed, in direct succession to one another. Each of spots 4001-4004 corresponds to a different portion of region 4000 that is spaced from the previously exposed portion by distance $d_s$ measured in the x-direction.

Following exposure of portions of region 4000 that correspond to spots 4001-4004, ion beam 192 is re-positioned again relative to region 4000, and the portion of region 4000 that corresponds to spot 4005 is exposed to ion beam 192. This portion of region 4000 is separated from each of the portions corresponding to spots 4001-4004 by a distance $e_s$ measured in the y-direction.

Portions of region 4000 that correspond to spots 4006-4008 are then exposed to ion beam 192 in direct succession to one another by first translating ion beam 192 in successive increments $d_s$ in the x-direction, and then exposing each portion to ion beam 192.

Following exposure of the region that corresponds to spot 4008, ion beam 192 is once again translated a distance $e_s$ in the y-direction, and the regions corresponding to spots 4009-4012 are exposed in order to ion beam 192, with successive translations of $d_s$ in the x-direction between the regions. Following the portion of the scanning protocol disclosed so far, a checkerboard exposure pattern that includes spots 4001-4012 is formed on region 4000 of sample 180.

After the portion corresponding to spot 4012 is exposed, ion beam 192 is re-positioned with respect to region 4000 and the portion of region 4000 that corresponds to exposure spot 4013 is exposed to ion beam 192. Thereafter, regions corresponding to exposure spots 4014-4024 are successively exposed with appropriate re-positioning of ion beam 192 (e.g., translations $d_s$ along the x-direction and $e_s$ along the y-direction) with respect to region 4000 between exposures.

Extending the re-positioning and exposure pattern shown in FIG. 2 leads to completion of a series of rows extending in the x-direction that include exposed portions of region 4000. Referring to FIG. 3, the rows of exposed regions are labeled 4100, 4200, and 4300. After all of the portions of region 4000 in rows 4100, 4200, and 4300 have been exposed to ion beam 192, the ion beam is repositioned relative to region 4000 to begin exposure of portions between the fully exposed rows. That is, according to the checkerboard scanning protocol, rows 4500, 4600, and 4700, which include unexposed portions of region 4000, are exposed to ion beam 192 by forming another plurality of exposure spots on region 4000. The exposure sequence for the portions between rows 4100, 4200, and 4300 is similar to the sequence described above. By sequentially scanning rows of portions of region 4000, the entire region 4000 can be exposed to ion beam 192.

Completion of the sequence of exposure spots shown in FIGS. 2 and 3 to completely expose region 4000 to ion beam 192 is effective in mitigating sample damage and surface charging because ion beam 192 does not expose a particular portion of region 4000 for an extended exposure time. Instead, ion beam 192 sweeps in relatively large steps (e.g., large relative to the average spot size $f_s$) across region 4000. Sample damage, which typically occurs for large ion currents distributed over relatively small areas, does not occur because the ion beam current is distributed over a relatively large area of region 4000. Interaction regions 3030 formed at each exposure spot do not significantly overlap spatially with one another. In addition, because ion beam 192 takes a relatively long time to revisit any particular exposed portion, diffusion and outgassing of implanted particles reduces the concentration of implanted particles in exposed portions when ion beam 192 does revisit the portions. The relatively long time interval between exposure of a particular portion and the ion beam revisiting the portion also allows for more extensive surface charge dissipation in insulating samples.

A particular number of exposure spots are formed on region 4000 in FIGS. 2 and 3, each of which corresponds to a portion of region 4000 that is exposed to ion beam 192. In general, however, region 4000 can be divided into any desired number of portions, each of which can be exposed to ion beam 192. The number of exposed portions of region 4000 can be determined based on a desired resolution of images of region 4000, for example.

Typically, exposure of region 4000 of sample 180 to ion beam 192 causes particles to leave sample 180. Particles which leave sample 180 can include secondary electrons, backscattered incident ions, scattered neutral atoms, and photons. Detectors that can be used to measure these various types of particles are discussed in part II of this disclosure. In general, as ion beam 192 is positioned relative to region 4000 and region 4000 is exposed to the ion beam, one or more detectors measure particles leaving sample 180. The one or more detectors generate electronic signals that correspond, for example, to abundances and/or energies and/or angular positions/orientations of the particles leaving sample 180. By correlating these generated electronic signals with the position of ion beam 192 relative to region 4000, one or more images of region 4000 can be formed.

In some embodiments, the average spot size $f_s$ of ion beam 192 at the surface of region 4000 can be 5 nm or less (e.g., 4 nm or less, 3 nm or less, 2 nm or less, 1 nm or less, 0.5 nm or less, 0.25 nm or less) and/or between 0.25 nm and 5 nm (e.g., between 0.5 nm and 4 nm, between 0.5 nm and 3 nm, between 0.5 nm and 2 nm).

In certain embodiments, $d_s$ can be 5 nm or more (e.g., 10 nm or more, 15 nm or more, 20 nm or more, 30 nm or more, 50 nm or more) and/or 500 nm or less (e.g., 400 nm or less, 300 nm or less, 200 nm or less, 100 nm or less). In some embodiments, $e_s$ can be 5 nm or more (e.g., 10 nm or more, 15 nm or more, 20 nm or more, 30 nm or more, 50 nm or more) and/or 500 nm or less (e.g., 400 nm or less, 300 nm or less, 200 nm or less, 100 nm or less).

In certain embodiments, a ratio $d_s/f_s$ can be 2 or more (e.g., 3 or more, 4 or more, 5 or more, 10 or more, 15 or more, 20 or more, 25 or more, 30 or more) and/or 100 or less (e.g., 90 or less, 80 or less, 70 or less, 60 or less, 50 or less). In some embodiments, a ratio $e_s/f_s$ can be 2 or more (e.g., 3 or more, 4 or more, 5 or more, 10 or more, 15 or more, 20 or more, 25 or more, 30 or more) and/or 100 or less (e.g., 90 or less, 80 or less, 70 or less, 60 or less, 50 or less). In certain embodiments, $e_s$ is greater than or equal to $d_s$. In some embodiments, $e_s$ is less than $d_s$.

In certain embodiments, when region 4000 is exposed to ion beam 192, an ion current of ion beam 192 is 1 pA or more (e.g., 2 pA or more, 5 pA or more, 10 pA or more, 20 pA or more, 30 pA or more, 50 pA or more, 100 pA or more, 200 pA or more, 300 pA or more, 500 pA or more). In general, the ion current is chosen to be sufficiently large so that measurement of sample images with relatively high signal-to-noise ratios is possible, while at the same time being low enough so that sample damage and charging are mitigated. The scanning protocols disclosed herein enable larger ion currents to be used than would otherwise be possible with simpler scanning protocols such as raster scanning the ion beam over region 4000.

In some embodiments, each portion of region 4000 can be exposed to ion beam 192 for an exposure time of 500 µs or less (e.g., 400 µs or less, 300 µs or less, 200 µs or less, 100 µs or less, 50 µs or less, 30 µs or less, 20 µs or less, 10 µs or less, 5 µs or less, 1 µs or less, 0.5 µs or less). In general, the exposure time is chosen to be sufficiently large so that measurement of sample images with relatively high signal-to-noise ratios is possible, while at the same time small enough so that sample damage and charging are mitigated.

In some embodiments, a total acquisition time of an image of the sample than includes $10^6$ pixels or more is 1000 seconds or less (e.g., 800 seconds or less, 600 seconds or less, 400 seconds or less, 300 seconds or less, 200 seconds or less, 100 seconds or less, 50 seconds or less, 30 seconds or less, 20 seconds or less, 10 seconds or less, 1 second or less).

In certain embodiments, to assist in dissipating excess charge in region 4000 which arises from exposure to ion beam 192, region 4000 can be exposed to an electron source such as a flood gun. Exposure to the electron source can occur prior to exposure to ion beam 192, for example, to implant a layer of charge within the sample. Alternatively, or in addition, region 4000 can be exposed to the electron source during exposure to ion beam 192. Electrons from the electron source can be used to assist surface charge dissipation, and also to promote departure of secondary electrons generated by ion beam 192 from the sample. Further alternatively, or in addition, region 4000 can be exposed to the electron source between successive complete scans of region 4000 by the ion beam, between successive line scans along different portions of region 4000 by the ion beam, and/or between successive exposure spots in different portions of region 4000 by the ion beam.

In general, when ions are incident on a surface of a sample, secondary electrons are produced and leave the sample, resulting in the surface having a net positive charge. Excess positive charges on the surface of the sample can produce a number of undesirable effects. For example, in certain embodiments, positive charging of the surface of the sample can limit the ability of detectors to detect secondary electrons that leave the sample due to the interaction of the ion beam with the sample. Attractive forces between positive charges at the surface of the sample and the secondary electrons can decelerate the electrons, preventing the electrons from reaching a detector.

In some embodiments, positive charging of the surface of the sample can cause inaccurate ion beam scanning Deflection and deceleration of the incident ion beam as a result of the electric field created by positive charges at the surface of the sample can reduce the energy of the incident ions, and change their trajectories in difficult-to-predict fashion.

If the net positive charge on the surface of the sample becomes large enough, the surface of the sample can act as an electrostatic mirror for incident ions, deflecting ions away from the surface of the sample before the ions reach the surface of the sample.

Figure 4:
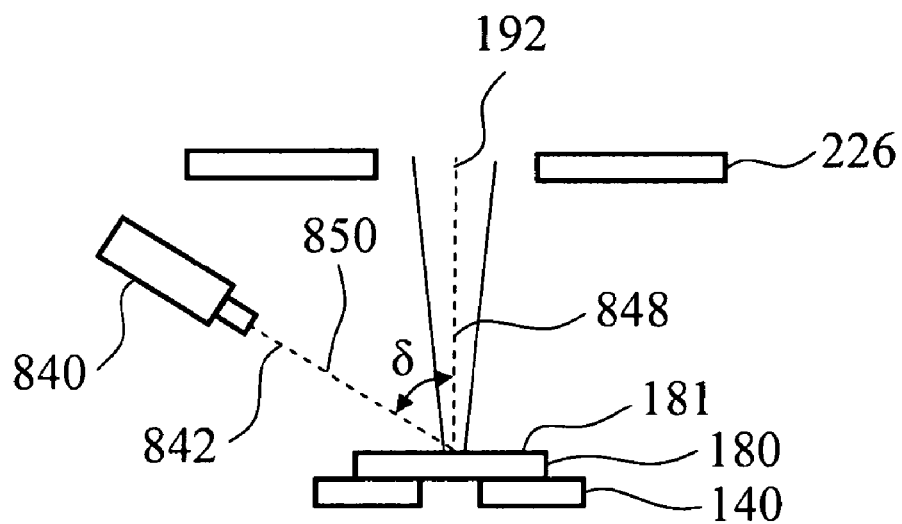
FIG. 4 is a schematic diagram of a portion of a gas field ion microscope including a flood gun.

A flood gun capable of delivering a flux of electrons to the surface of the sample can be used to counteract surface charging effects. FIG. 4 shows a portion of a gas field ion microscope that includes a flood gun 840 configured to deliver an electron beam 842 to surface 181 of sample 180 while a He ion beam 192 is incident on surface 181. The electron flux on surface 181 can, in general, be controlled so that surface charging effects are counterbalanced by electron beam 842 to the extent desired.

Figure 5:
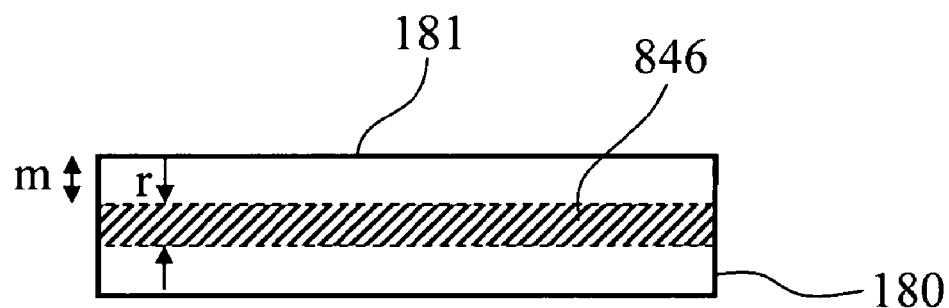
FIG. 5 is a schematic diagram of a sample including a sub-surface charge layer.

While FIG. 4 depicts ion beam 192 and electron beam 842 simultaneously impinging on surface 181 of sample 180, other approaches may be used. For example, prior to exposing surface 181 to ion beam 192, flood gun 840 can be configured to deliver electron beam 842 to sample 180 to create a charge layer 846 in a sub-surface region of sample 180 (FIG. 5). Layer 846 has an average depth m below surface 181, and layer 846 has a thickness r measured in a direction normal to surface 181. Generally, the depth m and thickness r, as well as the density of electrons in layer 846, can be controlled by the energy of the electrons in electron beam 842, the angle of incidence of the electrons in electron beam 842 with respect to surface 181, and the total dosage of electrons delivered to sample 180.

In some embodiments, when incident on surface 181, the average energy of the electrons in electron beam 842 is adjustable. For example, the average energy of the electrons can be 500 eV or more (e.g., 1 keV or more, 2 keV or more), and/or 20 keV or less (e.g., 15 keV or less, 10 keV or less). For example, when incident on surface 181, the average energy of the electrons in electron beam 842 can be from 500 eV to 20 keV (e.g., from 1 keV to 15 keV, from 2 keV to 10 keV).

The angle of incidence δ of the electrons in electron beam 842 with respect to surface 181 corresponds to the angle between a principal trajectory 850 of electron beam 842 and a normal 848 to surface 181. In general, δ is 0° or more (e.g., 10° or more, 20° or more), and/or 80° or less (e.g., 70° or less, 60° or less). For example, δ can be from 0° to 70° (e.g., from 0° to 10°, from 40° to 60°).

In certain embodiments, the total current of electrons delivered to sample 180 is 10 pA or more (e.g., 100 pA or more, 1 nA or more, 10 nA or more), and/or 100 µA or less (e.g., 10 µA or less, 1 µA or less, 500 nA or less, 100 nA or less). For example, the total current of electrons delivered to sample 180 can be from 10 pA to 1 µA (e.g., from 100 pA to 100 nA, from 1 nA to 10 nA).

In some embodiments, m is 10 nm or more (e.g., 25 nm or more, 50 nm or more, 75 nm or more, 100 nm or more), and/or 500 nm or less (e.g., 400 nm or less, 300 nm or less, 200 nm). For example, m can be from 10 nm to 500 nm (e.g., from 25 nm to 500 nm, from 50 nm to 500 nm, from 75 nm to 400 nm, from 100 nm to 400 nm).

In certain embodiments, multiple flood guns can be used. For example, in some embodiments, different flood guns can be used to expose different portions of surface 181 of sample 180 to electrons. In certain embodiments, each flood gun can be used to expose the same portion of surface 181 to electrons. Optionally, different flood guns can be operated at different times. For example, one or more flood guns can be used to expose surface 181 to electrons before surface 181 is exposed to incident ions (e.g., to form a sub-surface charge layer), while one or more different flood guns can be used to expose surface 181 to electrons while surface 181 is also being exposed to incident ions. In some embodiments, all the flood guns can be used to expose surface 181 to electrons before surface 181 is exposed to incident ions (e.g., to form a sub-surface charge layer), whereas in certain embodiments, all the flood guns can be used to expose surface 181 to electrons while surface 181 is also being exposed to incident ions. Other combinations may also be used.

In some embodiments, ion beam 192 can be formed of noble gas ions. For example, ion beam 192 can be formed of one or more of helium ions, neon ions, krypton ions, and xenon ions. Alternatively, or in addition, in certain embodiments, ion beam 192 can be formed of non-noble gas ions such as hydrogen ions.

Typically, the implanted particle diffusion rate is temperature dependent, and increases with increasing temperature. Accordingly, in certain embodiments, the sample can be heated during exposure to ion beam 192 to increase the rate at which implanted particles leave the sample. When the sample is heated, implanted particles diffuse out of the sample faster, so that when ion beam 192 revisits a previously exposed portion of region 4000, the residual concentration of implanted particles therein is lower than if the sample had not been heated. As a result, sample damage and charging can be mitigated.

Referring again to FIGS. 2 and 3, each exposure spot on region 4000 corresponds to a particular portion of region 4000 that is exposed to ion beam 192. Particles which leave the sample in response to the incident ion beam are detected and generate an electronic signal that is correlated with the position of ion beam 192 relative to region 4000. A plurality of such electronic signals, together with their correlated positions, are used to form images of region 4000. In some embodiments, each portion of region 4000 that is exposed to ion beam 192 corresponds to a single image pixel. For example, for an image that is formed of an array of n×n pixels, region 4000 can be divided into an array of n×n regions, each corresponding to one of the image pixels. Alternatively, in certain embodiments, one or more portions (e.g., each portion) of region 4000 can correspond to multiple image pixels.

In FIGS. 2 and 3, successively exposed portions of region 4000 are spaced by a distance $d_s$ from one another along the x-axis. In general, however, $d_s$ can represent the minimum spacing between successively exposed portions, and successively exposed portions can be spaced from one another by a distance $d_s$ or more along the x-axis. Further, the spacing between successively exposed regions may or may not be equal between all pairs of regions. In some embodiments, for example, successively exposed portions can be variably spaced from one another along the x-axis. Variable spacing can be used, for example, where certain portions of the sample have relatively fine features that are best imaged at higher resolution so that smaller spacings between successively exposed portions are used. Conversely, portions that include relatively coarse (or no) features of interest can be imaged at lower resolution (larger spacings between successively exposed portions) to increase the speed of image acquisition.

Similarly, in FIGS. 2 and 3, successive rows of exposed portions during implementation of the scanning protocol are spaced from one another by a distance $e_s$ in the y-direction. In general, spacings between rows can vary, with $e_s$ representing a minimum spacing between pairs of exposed rows. Relatively short spacings can be used for imaging at higher resolution, while longer spacings can be used for lower resolution imaging and higher speed. Moreover, $d_s$ and $e_s$ can have the same value so that exposed portions form a square pattern on region 4000, or different values so that a rectangular pattern is formed on region 4000.

In general, a variety of other scanning protocols can be used which involve modifications to the checkerboard protocol shown in FIGS. 2 and 3. For example, portions corresponding to the exposure spots shown in FIGS. 2 and 3 can generally be exposed in any order that is suitable for mitigating sample damage and charging as discussed above. Scanning protocols can include moving ion beam 192 relative to region 4000 in the x-direction, in the y-direction, or in both the x- and y-directions between successively scanned portions. The x- and y-directions, in general, may or may not be aligned with edges of region 4000 or of sample 180.

In some embodiments, patterns of exposure spots other than square and rectangular geometries can be used. For example, in some embodiments, circular (e.g., spiral) and/or elliptical patterns of exposure spots can be formed on region 4000. Ion beam 192 can be translated relative to region 4000 so that the ion beam exposes portions of region 4000 that form a series of concentric rings. The exposed portions can be spaced from one another by $d_s$ or more along the ring arcs, and concentric rings can be spaced along the radial direction by $e_s$ or more.

Figure 6:
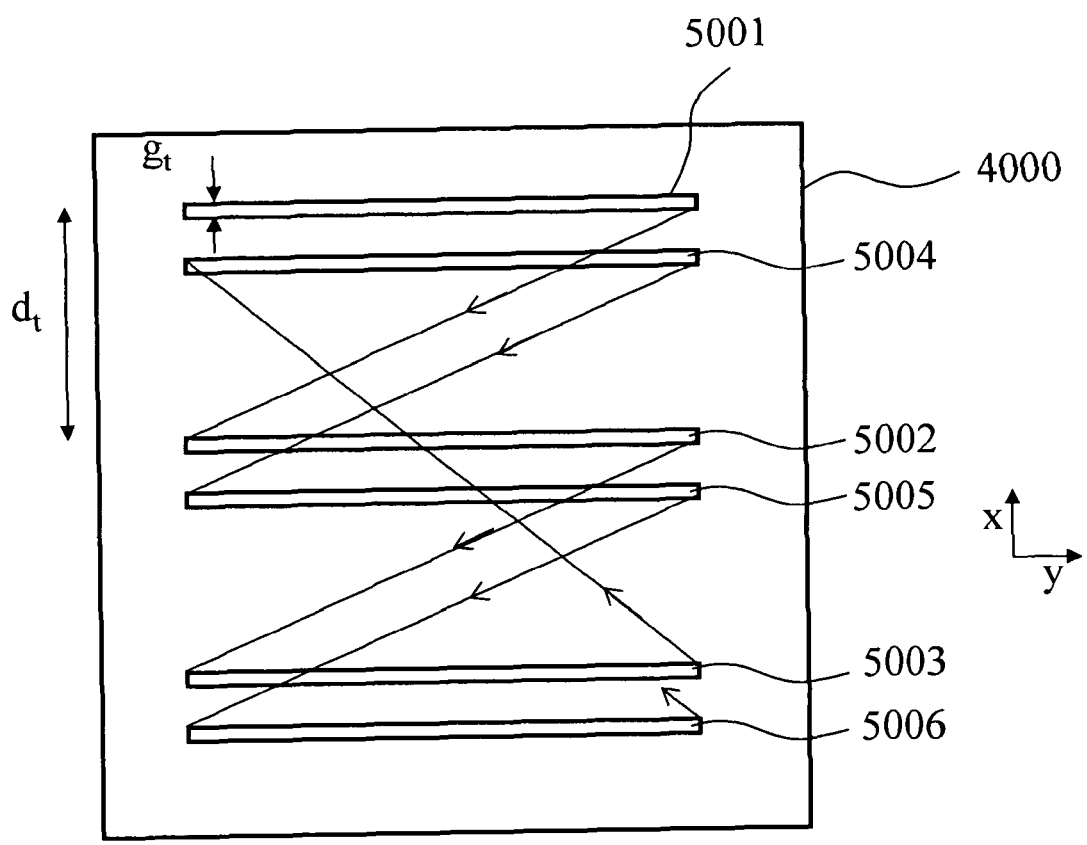
FIG. 6 is a schematic diagram showing a band scanning protocol for an ion beam.

Other types of scanning protocols can also be used. FIG. 6 shows an example of a band scanning protocol applied to exposure of region 4000 to ion beam 192. Ion beam 192 is positioned initially in the upper left corner of region 4000 shown in FIG. 6, and translated relative to region 4000 in the x-direction to form exposure line 5001 on region 4000. As ion beam 192 is translated relative to region 4000, particles leave region 4000 in response to the incident ions. The particles are detected by one or more detectors and signals generated by the detectors are correlated with the positions of ion beam 192.

After exposure line 5001 has been formed, ion beam 192 is re-positioned with respect to region 4000, and then scanned in the x-direction to form exposure line 5002. Repositioning of ion beam 192 includes translating ion beam 192 in the y-direction relative to region 4000 by an amount $d_t$ or more. A similar procedure is repeated to form exposure line 5003 on region 4000.

Following formation of exposure line 5003, ion beam 192 is re-positioned again with respect to region 4000, and then translated in the x-direction to form exposure line 5004. The process of re-positioning ion beam 192 and then translating the beam in the x-direction continues with formation of exposure lines 5005 and 5006. The pattern of exposing region 4000 along a series of exposure lines that are spaced by a distance $d_t$ from one another along the y-axis is repeated until all portions of region 4000 have been exposed.

Typically, for example, each exposure line includes a plurality of exposure spots. Ion beam 192 has an average spot size $f_s$ at the surface of region 4000, and the exposure spots in each exposure line are typically spaced from one another by a distance $f_s/2$ or more in the x-direction. In general, however, any desired spacing of the exposure spots in the x-direction can be used.

In general, the distance $d_t$ between successively exposed lines on region 4000 can have the same value as $d_s$ discussed previously. The spacings between successive exposure lines can be constant or can vary, for example, to control the resolution at which different portions of region 4000 are imaged. In some embodiments, a ratio $d_t/f_s$ can be 2 or more (e.g., 3 or more, 4 or more, 5 or more, 10 or more, 15 or more, 20 or more, 25 or more, 30 or more) and/or 100 or less (e.g., 90 or less, 80 or less, 70 or less, 60 or less, 50 or less).

Variations of the band scanning protocol can generally include any scanning protocol which prescribes forming exposure lines on region 4000, where doing so reduces sample damage and charging which would otherwise result from conventional scanning protocols such as raster scanning.

Typically, in the band scanning protocol, all of the regions that correspond to the exposure lines are exposed the same number of times before any regions are exposed another time to ion beam 192. In other words, complete image frames are acquired before any portion of a new image frame is acquired. In certain embodiments, however, portions of region 4000 can be exposed multiple times to ion beam 192 while other portions are exposed to ion beam 192 a smaller number of times. This non-uniform exposure can be used, for example, to provide improved signal-to-noise ratios in images of certain portions of region 4000.

In some embodiments, images can be formed from interlaced image frames. For example, to acquire an image of region 400, ion beam 192 can be scanned relative to region 4000 to form a series of exposure lines on region 4000. The exposure lines can cover only a certain fraction (e.g., half) of region 4000, for example, and a first image frame can be formed based on particles leaving region 4000 in response to the incident ion beam. Ion beam 192 can then be scanned a second time relative to region 4000 to expose portions which were not exposed during the first scan. A second image frame can be formed based on particles leaving region 4000 in response to the incident ion beam. The first and second image frames can, for example, each include a series of alternating exposure lines on the surface of region 4000, so that the first and second image frames correspond to interlaced image frames. A complete image of region 4000 can be formed by combining the first and second image frames.

In certain embodiments, different portions of the exposure lines can be formed on region 4000 at different times by scanning ion beam 192 relative to region 4000. For example, ion beam 192 can be scanned along a first portion of each of the exposure lines shown in FIG. 6 in a first exposure step. Then, in a second exposure step, ion beam 192 can be scanned along the remaining portions of each of the exposure lines to complete exposure of region 4000.

As shown in FIG. 6, the exposure lines have a width $g_t$ measured in the y-direction. In some embodiments, $g_t$ is 0.25 nm or more (e.g., 0.5 nm or more, 1 nm or more, 2 nm or more, 3 nm or more, 4 nm or more, 5 nm or more, 6 nm or more, 7 nm or more, 8 nm or more). In certain embodiments, a ratio $d_t/g_t$ has a value of 2 or more (e.g., 3 or more, 4 or more, 5 or more, 6 or more, 7 or more, 10 or more, 15 or more, 20 or more, 30 or more, 40 or more, 50 or more).

Parameters of various scanning protocols are compared in Table I. To obtain the numbers shown in the table, a square exposure region with a side length of 100 nm was assumed. The square region was divided into an array of 1000×1000 pixels, each corresponding to an exposure spot. In addition, a minimum exposure time per pixel was established as 0.1 µs, corresponding to the maximum rate at which the ion beam could be translated relative to the sample. The ion beam particle current $C_i$, the equivalent probing current $I_i$, the total acquisition time to expose each pixel to at least 600 incident ions, and the exposure time per pixel were calculated with the constraint that the number of He particles in region 3030 did not exceed $M_b$=6000 particles (e.g., the saturated concentration of helium in gold).

TABLE 1

| Protocol | Particle Current $C_i$ | Probe Current $I_i$ | Acquisition Time | Exposure Time per Pixel |
|---|---|---|---|---|
| Pixel Averaging | $5 \times 10^5 \text{ s}^{-1}$ | 0.084 pA | 1200 s | 1200 µs |
| Line Averaging | $2.4 \times 10^6 \text{ s}^{-1}$ | 0.4 pA | 250 s | <12.5 µs |
| Frame Averaging | $3.9 \times 10^6 \text{ s}^{-1}$ | 0.65 pA | 154 s | 0.1 µs |
| Band Scanning | $1.2 \times 10^7 \text{ s}^{-1}$ | 2 pA | 50 s | <2.5 µs |
| Checkerboard Scanning | $1.2 \times 10^7 \text{ s}^{-1}$ | 2 pA | 50 s | <50 µs |

In a conventional pixel averaging scanning protocol, a region of a sample of interest is scanned line-by-line in a conventional raster pattern. That is, each successive row of the region is scanned from one end to the other, and the ion beam does not skip over rows during the scan. As shown in Table I, for this scanning protocol, to avoid saturation of implanted He particles in the sample, the ion beam current must remain relatively low, which results in a relatively long acquisition time.

In a conventional line averaging scanning protocol, each row of the region can be scanned multiple times before the ion beam moves to scan a successive row. As in the pixel averaging protocol, the ion beam does not skip over rows during the scan. However, allowing the ion beam to revisit pixels in the same row multiple times before moving on to the next line permits higher ion beam currents to be used. As a result, the total acquisition time is reduced as shown in the second row of Table I.

In a frame averaging scanning protocol, individual frames—each corresponding to a pixel-averaged scan of the region—are obtained and combined to form the image. However, because the ion beam can re-scan each row of the region multiple times (e.g., once in each additional frame), the ion beam current can be further increased while avoiding saturation of implanted He particles in the sample. As shown in Table I, the frame averaging scanning protocol is effectively limited by the dwell time, which is in turn fixed by the maximum rate at which the ion beam can be translated relative to the region of interest.

For the band scanning protocol shown schematically in FIG. 6, an image is acquired by scanning the region line-by-line, and the image can further be formed by integrating multiple frames. The difference between the frame averaging scanning protocol and the band scanning protocol is that in the band scanning protocol, successively scanned rows are separated by a distance $d_t$ measured along the y-direction. Due to the separation between successively scanned rows, interaction regions 3030 in portions of the sample that correspond to exposure spots in the scanned rows do not overlap too significantly with one another. In a conventional frame averaging scanning protocol, the ratio of the exposure time per pixel to the time required for the ion beam to revisit the same pixel is roughly $(d_v/b_v)$. In the band scanning protocol, this ratio is roughly $(d_v/b_v)^2$, which has a significantly smaller value. As shown in Table I, the band scanning protocol enables much higher ion beam currents to be used, and at the same time provides for shortened total acquisition times relative to the other scanning protocols.

For the checkerboard scanning protocol shown schematically in FIGS. 2 and 3, each image frame is subdivided into a series of square or rectangular sub-regions, and the ion beam visits a similar corresponding position in each sub-region before any sub-region is revisited. On subsequent visits from the ion beam, the relative position of the ion beam in each sub-region is shifted relative to the previous visit. Repeating this pattern exposes the entire region of interest.

The checkerboard scanning protocol results in an even further reduction in spatial overlap between interaction regions 3030 that result from exposure of the sample to the ion beam. For short exposure times, images of the sample can be formed by integrating multiple image frames. In Table I, the ion beam current is limited to the same value as for the band scanning protocol due to the outgassing rate of implanted helium particles. However, the exposure time per pixel can increase due to the further decreased spatial overlap between interaction regions 3030, relative to the band scanning protocol. In fact, in the present calculations, the exposure time per pixel is constrained by the minimum dose of 600 particles per pixel. For example, if the minimum dose of particles per pixel was larger than 6000, the exposure time per pixel could increase to 500 µs, which would help to reduce instrument noise that arises from rapid re-positioning of the ion beam. The increased exposure time per pixel could not be implemented in the other scanning protocols shown in Table I due to proximity of the interaction regions in each of the other protocols.

It has been observed by the inventors that under typical operating conditions, a generalized relationship can be established between the time period during which portions of region 4000 are continuously exposed to the ion beam and the time period during which each of the portions is not exposed to the ion beam, to mitigate the effects of sample damage and/or charging as a result of ion beam exposure. This relationship permits good quality images of the sample to be obtained.

Figure 7A:
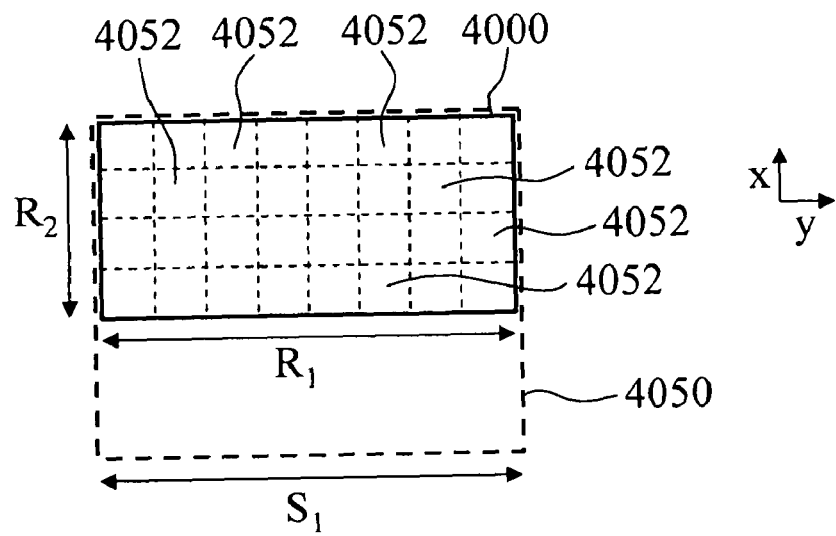
FIG. 7A is a schematic diagram showing a method for determining exposure conditions for portions of a sample.

Referring to FIG. 7A, a region 4000 of a sample 180 is to be exposed to ion beam 192 to obtain one or more images of the region. Region 4000 is typically a rectangular or square region with length $R_1$ and width $R_2$. To determine the relationship between the continuous exposure and non-exposure times for portions of region 4000, a side length $S_1$ of a square region 4050 is determined, where the square region 4050 corresponds to the smallest square region that fully encloses region 4000. As shown in FIG. 7A, determining the side length $S_1$ of square region 4050 for a rectangular or square region 4000 corresponds to determining a maximum dimension (e.g., $R_1$ or $R_2$) of region 4000. Thus, for region 4000 shown in FIG. 7A, $S_1=R_1$. In some embodiments, region 4000 may not be a square region, although in general, determining the side length of square region 4050 will still correspond to determining a maximum dimension of region 4000.

Region 4000 has an area A. The next step in the procedure is to set the side length of square region 4050, $S_1$, equal to the product $F \cdot \sqrt{A}$, where F is a numerical constant that is then easily determined. If region 4000 is a square region, then the value of F will be 1. However, if region 4000 is not square, then F can generally have values other than 1.

Next, region 4000 is divided into a series of M square portions, each of which has the same area and is to be separately exposed to ion beam 192. In general, each of the M portions corresponds to a number of image pixels in images of region 4000. For example, in some embodiments, images of region 4000 include U total pixels, and each of the M portions corresponds to between 4 pixels and U/4 pixels of the image.

Exposure of region 4000 to form a single image frame proceeds as follows. For each of the M portions of region 4000, a subset of the portion is continuously exposed to the ion beam for a time period $t_1$. The subset of the portion corresponds to one or more pixels in images of the portion. Then, the ion beam is translated so that a subset of another portion is continuously exposed to the ion beam. Eventually, the ion beam returns to each of the M portions to expose a different subset of each portion (e.g., a subset of each portion which has not already been exposed to the ion beam). The exposing of subsets of portions, followed by translation of the ion beam to other portions, continues until all subsets of each of the portions have been exposed to the ion beam, thereby completing exposure of region 4000 and formation of a single image frame.

In some embodiments, the exposed subsets of each of the M portions correspond to equal numbers of image pixels. In certain embodiments, the exposed subsets correspond to different numbers of image pixels. The M portions can, in some embodiments, be determined according to an approximate interaction volume of incident ions with the material of region 4000. The interaction volume can be measured experimentally and used to determine the number (and therefore, the spacing) of portions M in region 4000. Alternatively, or in addition, the interaction volume of incident ions with the material of region 4000 can be estimated from a database such as a table of measured interaction volumes in particular materials. Once the interaction volume is estimated from such a database, the number and spacing of portions M in region 4000 can be determined.

In some embodiments, the time period between successive continuous exposures of one of the M portions to the ion beam is the same for that one portion, and the same for all M portions of region 4000. More generally, however, the time period between successive continuous exposures of one of the M portions to the ion beam can vary for a given portion, and can vary from portion to portion within region 4000.

The time period $t_2$ is the shortest time period between successive exposures of any of the M portions to the ion beam. For a given region 4000 and number of portions M, the values of $t_1$ and $t_2$ can vary widely according to different exposure protocols. In general, however, the time periods $t_1$ and $t_2$ are selected so that $$\frac{t_1}{t_1+t_2} \le \frac{1}{2F}\sqrt{\frac{1}{M}} \qquad (1)$$

The equality in Equation (1) represents an upper limit on the value of the ratio $$\frac{t_1}{t_1+t_2}.$$

In the value of this ratio can be equal to or less than the value shown on the right side of Equation (1). For example, in some embodiments, the value of $$\frac{t_1}{t_1+t_2}$$

is $\frac{1}{3}F\sqrt{1/M}$ or less (e.g., $\frac{1}{4}F\sqrt{1/M}$ less, $\frac{1}{5}F\sqrt{1/M}$ or less, $\frac{1}{10}F\sqrt{1/M}$ or less, or even less).

In general, any of the scanning protocols disclosed herein can be implemented according to the relationship discussed above between the continuous exposure time $t_1$ of the M portions and the shortest time period $t_2$ between successive exposures of any of the M portions. For example, both the checkerboard scanning protocol and the band scanning protocol, and variations thereof, can be implemented according to the relationship in Equation (1) to mitigate sample damage and charging.

A comparison between different scanning protocols is shown in FIG. 7A. Region 4000 in FIG. 7A corresponds to 1000 image pixels on each side (F=1), and is divided into M=100 portions (a 10×10 array of portions), where each of the M portions corresponds to 10000 image pixels (a 100×100 array of pixels). Each image pixel corresponds to a single exposure spot (e.g., where the ion beam exposes a spot in region 4000), and the exposure time for each spot is 1 μs. Therefore, without accounting for beam translation time and other factors, the total time required to expose all spots in region 4000 (e.g., all pixels in an image of region 4000) is 1 second. In this example, each of the M portions is exposed to the ion beam in the same manner for purposes of clarity.

In a standard pixel averaging scanning protocol, rows of exposure spots in region 4000 are exposed sequentially to the ion beam. For example, referring to FIG. 7A, rows are exposed in the order 1-2-3-4-5 . . . -1000 to complete acquisition of an image of region 4000. Referring to portion M1 in region 4000, when exposing from row-to-row sequentially, the ion beam continuously exposes 100 spots in portion M1 before moving to portion M2. Each spot is exposed for 1 μs, and so $t_1$=100 μs. The shortest time period between successive exposures of any one of the M portions to the ion beam, $t_2$, is the same for all portions. The ion beam exposes 100 spots in each of portions M2 through M10, and then returns to portion M1 to expose 100 spots in row 2. Thus, the shortest time period between successive exposures of portion M1 is $t_2$=900 μs. The ratio $$\frac{t_1}{t_1 + t_2}$$

has a value 0.1, which is larger than $$\frac{1}{2}\sqrt{\frac{1}{M}} = 0.05.$$

In a standard pixel averaging band protocol, each of the rows of pixels (e.g., rows 1-100) in portions M1-M10 are exposed sequentially to the ion beam. Then, portions M11-M20 are skipped, and the rows of pixels (e.g., rows 201-300) in portions M21-M30 are exposed sequentially to the ion beam. For this scanning protocol, however, the time periods $t_1$ and $t_2$ have the same values as for the sequential pixel scanning protocol, and the ratio $$\frac{t_1}{t_1 + t_2}$$

has a value 0.1, which is larger than $$\frac{1}{2}\sqrt{\frac{1}{M}} = 0.05.$$

Figure 7B:
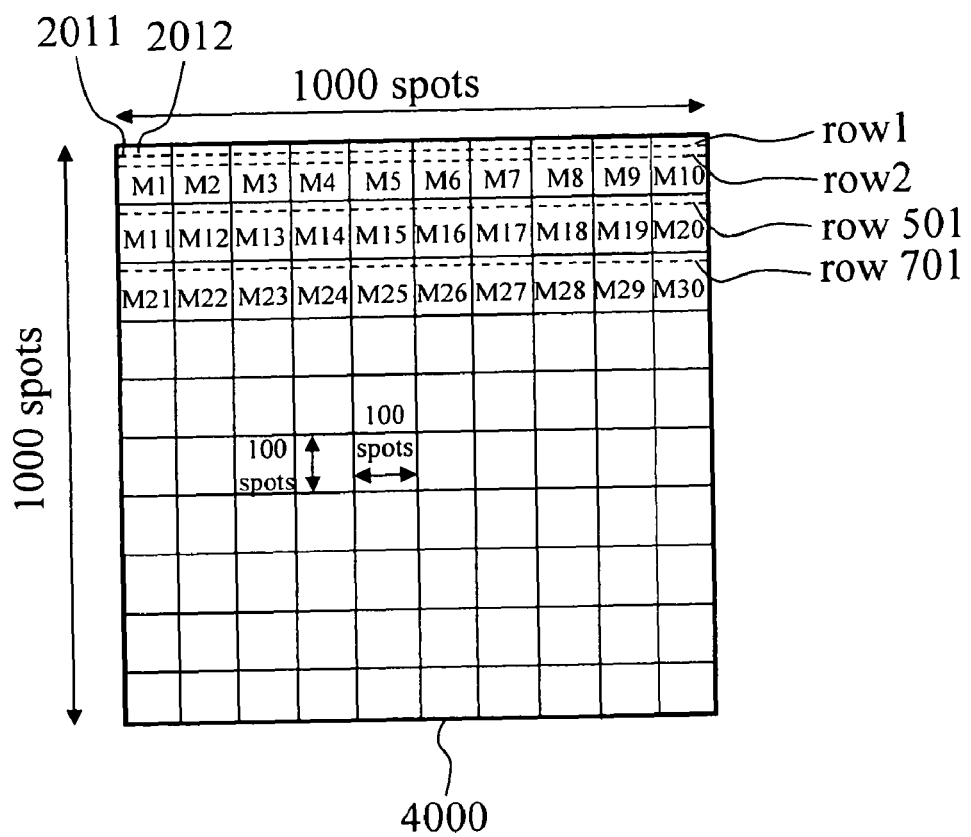
FIG. 7B is a schematic diagram comparing different exposure protocols for a sample.

In a band scanning protocol such as the protocol shown schematically in FIG. 6, single rows of spots within each of the M portions are exposed before additional rows of spots in any of the M portions are exposed. For example, referring to FIG. 7B, rows 1, 101, 201, 301, . . . 901 are exposed, followed by rows 2, 102, 202, 302, . . . 902, and so on. The continuous exposure time for each portion is $t_1$=100 μs (the time required to expose all spots in a single row of each portion). The shortest time between successive exposures of each of the portions is 9900 μs. For example, considering portion M1, $t_2$ corresponds to the time period between exposure of the last spot in row 1 of portion M1 and the first spot in row 2 of portion M1. This period includes 900 μs during which other spots in row 1 (e.g., in portions M2-M10) are exposed, and 9000 μs during which 1000 spots in each of rows 101, 201, 301, . . . 901 are exposed. For the band scanning protocol, the ratio $$\frac{t_1}{t_1 + t_2}$$

has a value 0.01, which is less than $$\frac{1}{2}\sqrt{\frac{1}{M}} = 0.05.$$

In a checkerboard scanning protocol such the protocol shown schematically in FIG. 3, single spots within each of the M portions are exposed before additional spots in any of the M portions are exposed. In terms of spot coordinates in FIG. 7B, spots (1,1), (1,101), (1,201), . . . (1,901), (101,1), (101, 101), . . . (901,901) are exposed—each of portions M1-M100 including exactly one of these spots—and then the ion beam returns to portion M1 to expose (1,2), followed by (1,102) in portion M2, (1,202) in portion M3, and so on. The continuous exposure time for each portion (e.g., portion M1) is the exposure time for a single spot, $t_1$=1 μs. The shortest time between successive exposures of each to the M portions is $t_2$=99 μs, since a corresponding spot in each of portions M2-M99 is exposed before the ion beam returns to portion M1 to expose a second spot. For the checkerboard scanning protocol, the ratio $$\frac{t_1}{t_1 + t_2}$$

has a value 0.01, which is less than $$\frac{1}{2}\sqrt{\frac{1}{M}} = 0.05.$$

Therefore, as shown in the above example, the band scanning and checkerboard scanning protocols satisfy the relationship given by Equation (1), and are therefore effective at reducing sample damage and/or charging that arises from ion beam exposure.

Gas assisted chemistry is commonly used during semiconductor fabrication to add material to and/or remove material from a given layer in a multi-layer semiconductor device. For example, gas assisted chemistry can be used for semiconductor circuit editing—to repair damaged or incorrectly fabricated circuits formed in semiconductor articles. Gas assisted chemistry can also be used in photolithographic mask repair, where material can be added to or removed from masks to repair defects which result from use or incorrect fabrication. The process generally involves interacting electrons with an activating gas to form a reactive gas that can then participate in chemistry at the surface of a semiconductor article to add material to the surface, remove material from the surface, or both. Typically, the electrons are generated as secondary electrons resulting from the interaction of a Ga ion beam with the sample and/or the electrons are generated as secondary electrons resulting from the interaction of an electron beam (e.g., produced by a SEM) with the sample. Optionally, an appropriate pumping system can be used to remove undesirable volatile products of the surface chemistry.

Examples of activating gases that can be used to remove material from the surface include $Cl_2$, $O_2$, $I_2$, $XeF_2$, $F_2$, $CF_4$ and $H_2O$. As an example, in some embodiments, a surface region formed of chrome, chrome oxide, chrome nitride and/or chrome oxynitride can be at least partially removed by interacting electrons with $Cl_2$ and/or $O_2$, and allowing the resulting chemical species to etch the surface region. As another example, in certain embodiments, a surface region formed of a tantalum nitride can be at least partially removed by interacting electrons with $XeF_2$, $F_2$ and/or $CF_4$, and allowing the resulting chemical species to etch the surface region. As a further example, in certain embodiments, a surface region formed of a carbon-containing material can be at least partially removed by interacting electrons with $H_2O$ and/or $O_2$, and allowing the resulting chemical species to etch the surface region.

An example of an activating gas that can be used to deposit a material on the surface is $WF_6$ (to deposit W, such as a W plug).

An ion beam generated by the interaction of gas atoms with the gas field ion source (e.g., the He ion source) described herein can be used to perform gas assisted chemistry. In such a process, for example, the secondary electrons that leave the sample due to the interaction of the ion beam with the sample can be the electrons used to assist in the chemistry. Using such an ion beam can offer several advantages relative to using a Ga ion beam. As an example, undesirable ion implantation can be reduced (e.g., eliminated) using a He ion beam, whereas undesirable implantation of Ga is a common problem when a Ga ion beam is used. As another example, a gas field ion beam (e.g., a He ion beam) can provide improved resolution relative to a Ga ion beam and/or an incident electron beam (e.g., an incident electron beam produced by a SEM), which can allow for the more precise and/or controllable use of the chemistry. This can, for example, reduce (e.g., eliminate) the undesirable interaction of ions with certain portions of a sample (e.g., such as can occur with a Ga ion beam where the beam profile has tails that extend to undesirable regions of the sample where Ga implantation can create problems with the performance of the semiconductor article).

As discussed above, when the ion beam is used to perform beam-assisted chemistry in a sample, surface-adsorbed chemical agents interact with secondary electrons generated by the ion beam and undergo chemical reactions with the sample. The chemical reactions can lead to controlled structural modification of the sample. Consumed chemical agents on the sample surface can be replenished by exposing the sample to additional quantities of the agents (e.g., via a gas flow nozzle).

If the ion beam is scanned over the sample surface in a simple line-by-line, standard raster pattern, the ion beam interrogates portions of the sample surface (e.g., ion beam spots) where the adsorbed chemical agents have already been depleted due to interactions with the ion beam positioned in a prior, adjacent location (e.g., beam spot). However, when the ion beam is scanned according to the scanning protocols disclosed herein, sequential beam spots are spaced from one another by a larger amount than in conventional raster scanning protocols. At each position of the ion beam on the surface of the sample, the adsorbed chemical agents have not yet interacted with secondary electrons produced by the ion beam or, alternatively, the adsorbed chemical agents have been replenished following a previous interaction with secondary electrons produced by the ion beam. Thus, the efficiency of ion beam-induced chemistry at the sample can be enhanced by scanning the sample surface with the ion beam according to the scanning protocols disclosed herein, so that the interval between successive exposures of any region of the sample is relatively long.

II. Ion Beam Systems

This section discloses systems and methods for producing ion beams, and detecting particles that leave a sample of interest due to exposure of the sample to an ion beam. The systems and methods can be used to obtain one or more images of the sample. Typically, the gas ion beams that are used to interrogate samples are produced in multipurpose microscope systems.

Microscope systems that use a gas field ion source to generate ions that can be used in sample analysis (e.g., imaging) are referred to as gas field ion microscopes. A gas field ion source is a device that includes an electrically conductive tip (typically having an apex with 10 or fewer atoms) that can be used to ionize neutral gas species to generate ions (e.g., in the form of an ion beam) by bringing the neutral gas species into the vicinity of the electrically conductive tip (e.g., within a distance of about four to five angstroms) while applying a high positive potential (e.g., one kV or more relative to the extractor (see discussion below)) to the apex of the electrically conductive tip.

Figure 8:
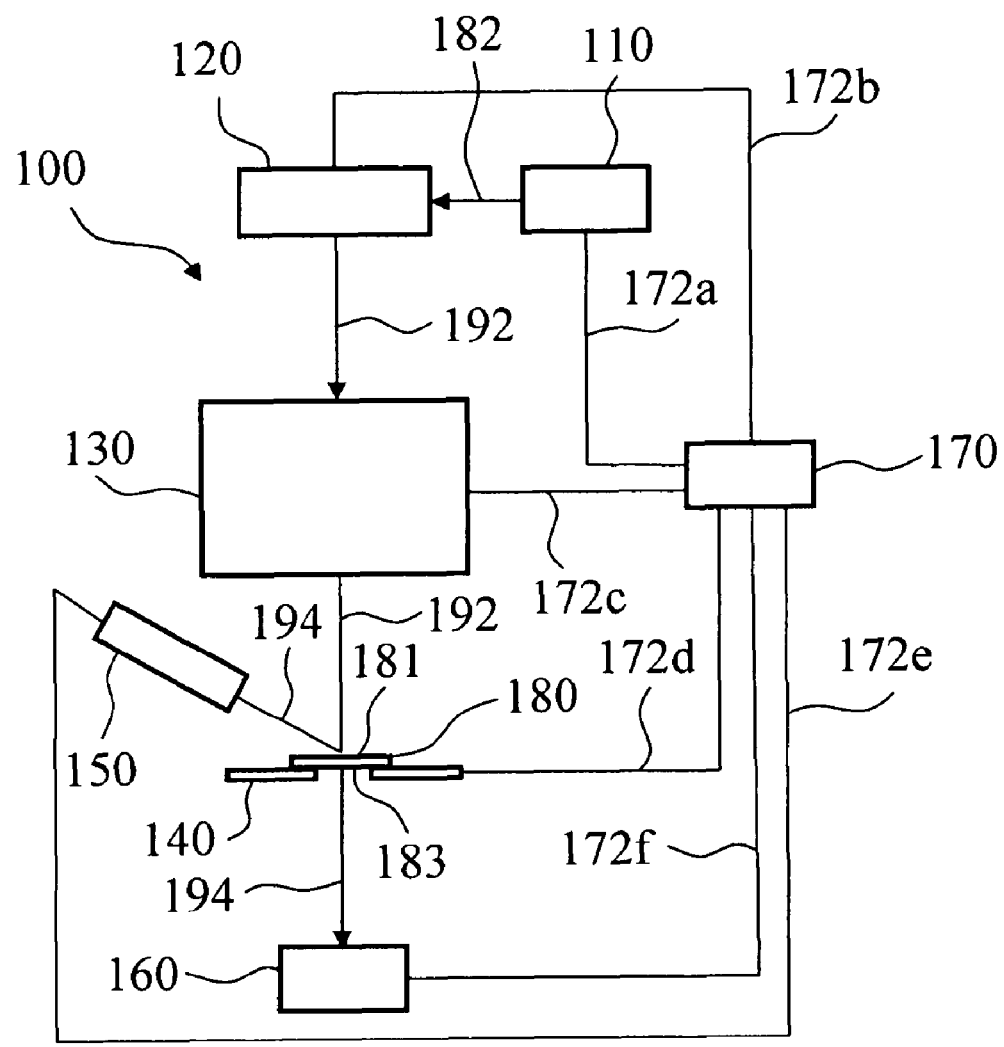
FIG. 8 is a schematic diagram of an ion microscope system.

FIG. 8 shows a schematic diagram of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172a-172f. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160.

In general, it is desirable to reduce the presence of certain undesirable chemical species in system 100 by evacuating the system. Typically, different components of system 100 are maintained at different background pressures. For example, gas field ion source 120 can be maintained at a pressure of approximately $10^{-10}$ Torr. When gas is introduced into gas field ion source 120, the background pressure rises to approximately $10^{-5}$ Torr. Ion optics 130 are maintained at a background pressure of approximately $10^{-8}$ Torr prior to the introduction of gas into gas field ion source 120. When gas is introduced, the background pressure in ion optics 130 typically increase to approximately $10^{-7}$ Torr. Sample 180 is positioned within a chamber that is typically maintained at a background pressure of approximately $10^{-6}$ Torr. This pressure does not vary significantly due to the presence or absence of gas in gas field ion source 120.

Figure 9:
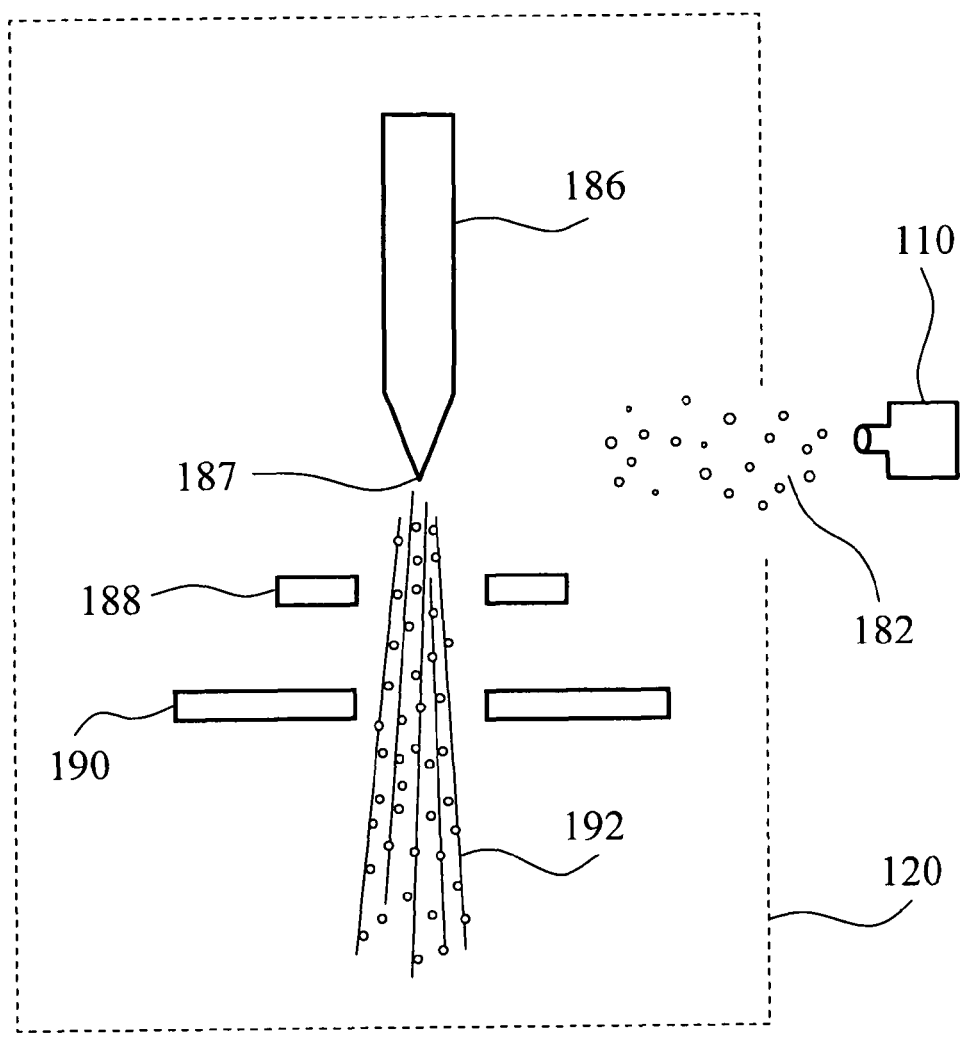
FIG. 9 is a schematic diagram of a gas field ion source.

As shown in FIG. 9, gas source 110 is configured to supply one or more gases 182 to gas field ion source 120. As described in more detail below, gas source 110 can be configured to supply the gas(es) at a variety of purities, flow rates, pressures, and temperatures. In general, at least one of the gases supplied by gas source 110 is a noble gas (helium (He), neon (Ne), argon (Ar), krypton (Kr), xenon (Xe)), and ions of the noble gas are desirably the primary constituent in ion beam 192. In general, as measured at surface 181 of sample 180, the current of ions in ion beam 192 increases monotonically as the pressure of the noble gas in system 100 increases. In certain embodiments, this relationship can be described by a power law where, for a certain range of noble gas pressures, the current increases generally in proportion to gas pressure. During operation, the pressure of the noble gas is typically $10^{-2}$ Torr or less (e.g., $10^{-3}$ Torr or less, $10^{-4}$ Ton or less), and/or $10^{-7}$ Ton or more (e.g., $10^{-6}$ Ton or more, $10^{-5}$ Torr or more) adjacent the tip apex (see discussion below). In general, it is desirable to use relatively high purity gases (e.g., to reduce the presence of undesirable chemical species in the system). As an example, when He is used, the He can be at least 99.99% pure (e.g., 99.995% pure, 99.999% pure, 99.9995% pure, 99.9999% pure). Similarly, when other noble gases are used (Ne gas, Ar gas, Kr gas, Xe gas), the purity of the gases is desirably high purity commercial grade.

Optionally, gas source 110 can supply one or more gases in addition to the noble gas(es). As discussed in more detail below, an example of such a gas is nitrogen. Typically, while the additional gas(es) can be present at levels above the level of impurities in the noble gas(es), the additional gas(es) still constitute minority components of the overall gas mixture introduced by gas source 110. As an example, in embodiments in which He gas and Ne gas are introduced by gas source 110 into gas field ion source 120, the overall gas mixture can include 20% or less (e.g., 15% or less, 12% or less) Ne, and/or 1% or more (e.g., 3% or more, 8% or more) Ne. For example, in embodiments in which He gas and Ne gas are introduced by gas source 110, the overall gas mixture can include from 5% to 15% (e.g., from 8% to 12%, from 9% to 11%) Ne. As another example, in embodiments in which He gas and nitrogen gas are introduced by gas source 110, the overall gas mixture can include 1% or less (e.g., 0.5% or less, 0.1% or less) nitrogen, and/or 0.01% or more (e.g., 0.05% or more) nitrogen. For example, in embodiments in which He gas and nitrogen gas are introduced by gas source 110, the overall gas mixture can include from 0.01% to 1% (e.g., from 0.05% to 0.5%, from 0.08 to 0.12%) nitrogen. In some embodiments, the additional gas(es) are mixed with the noble gas(es) before entering system 100 (e.g., via the use of a gas manifold that mixes the gases and then delivers the mixture into system 100 through a single inlet). In certain embodiments, the additional gas(es) are not mixed with the noble gas(es) before entering system 100 (e.g., a separate inlet is used for inputting each gas into system 100, but the separate inlets are sufficiently close that the gases become mixed before interacting with any of the elements in gas field ion source 120).

Gas field ion source 120 is configured to receive the one or more gases 182 from gas source 110 and to produce gas ions from gas(es) 182. Gas field ion source 120 includes an electrically conductive tip 186 with a tip apex 187, an extractor 190 and optionally a suppressor 188. Typically, the distance from tip apex 187 to surface 181 of sample 180 (not shown in FIG. 2) is five cm or more (e.g., 10 cm or more, 15 cm or more, 20 cm or more, 25 cm or more), and/or 100 cm or less (e.g., 80 cm or less, 60 cm or less, 50 cm or less). For example, in some embodiments, the distance from tip apex 187 to surface 181 of sample 180 is from five cm to 100 cm (e.g., from 25 cm to 75 cm, from 40 cm to 60 cm, from 45 cm to 55 cm).

Electrically conductive tip 186 can be formed of various materials. In some embodiments, tip 186 is formed of a metal (e.g., tungsten (W), tantalum (Ta), iridium (Ir), rhenium (Rh), niobium (Nb), platinum (Pt), molybdenum (Mo)). In certain embodiments, electrically conductive tip 186 can be formed of an alloy. In some embodiments, electrically conductive tip 186 can be formed of a different material (e.g., carbon (C)).

During use, tip 186 is biased positively (e.g., approximately 20 kV) with respect to extractor 190, extractor 190 is negatively or positively biased (e.g., from −20 kV to +50 kV) with respect to an external ground, and optional suppressor 188 is biased positively or negatively (e.g., from −5 kV to +5 kV) with respect to tip 186. Because tip 186 is formed of an electrically conductive material, the electric field of tip 186 at tip apex 187 points outward from the surface of tip apex 187. Due to the shape of tip 186, the electric field is strongest in the vicinity of tip apex 187. The strength of the electric field of tip 186 can be adjusted, for example, by changing the positive voltage applied to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130.

As an example, without wishing to be bound by theory, it is believed that He ions can be produced as follows. Gas field ion source 120 is configured so that the electric field of tip 186 in the vicinity of tip apex 187 exceeds the ionization field of the un-ionized He gas atoms 182, and tip 186 is maintained at a relatively low temperature. When the un-ionized He gas atoms 182 are in close proximity to tip apex 187, the He atoms can be polarized by the electric field of the tip, producing a weakly attractive force between He atoms 182 and tip apex 187. As a result, He atoms 182 may contact tip apex 187 and remain bound (e.g., physisorbed) thereto for some time. In the vicinity of tip apex 187, the electric field is high enough to ionize He atoms 182 adsorbed onto tip apex 187, generating positively charged He ions (e.g., in the form of an ion beam).

Figure 10:
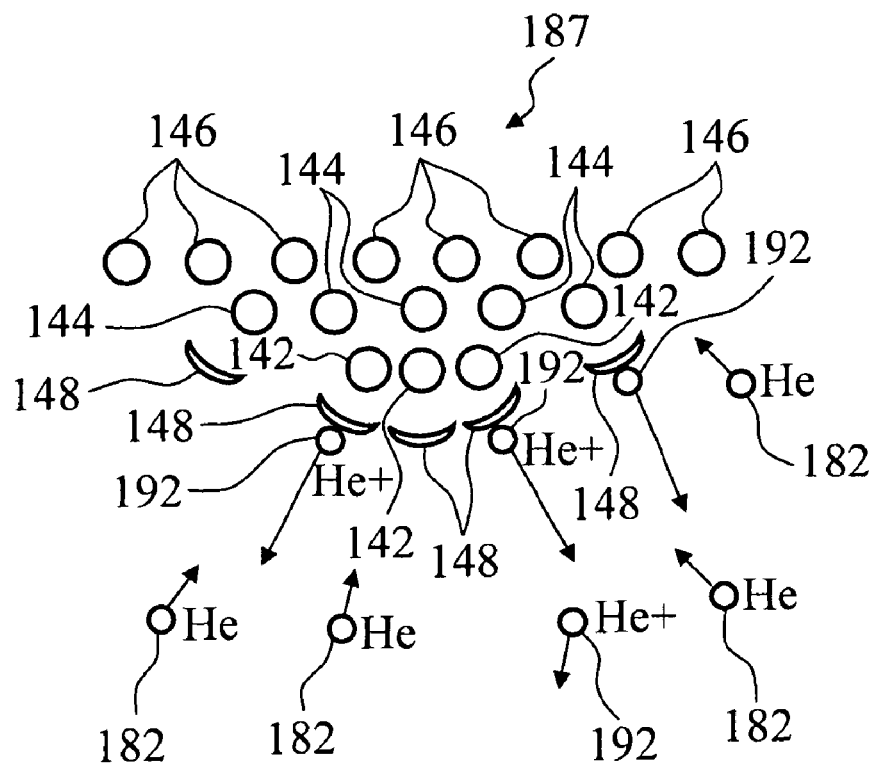
FIG. 10 is a schematic representation of an enlarged side view of an embodiment of a tip apex.

FIG. 10 is a schematic representation of tip apex 187 (formed of W(111), see discussion below). Tip apex 187 includes layers of atoms arranged to form atomic shelves. A terminal atomic shelf is formed by atoms 142. A second atomic shelf is formed by atoms 144, and a third atomic shelf is formed by atoms 146. Neutral gas atoms 182 delivered by gas source 110 are present in the vicinity of tip apex 187. Atoms 182 become polarized due to the electric field of tip apex 187, and experience a relatively weak attractive force that causes atoms 182 to move towards tip apex 187, as indicated by the arrows on atoms 182.

Depending upon the strength of the tip's electric field, each atoms in the atomic shelves near tip apex 187 can have a corresponding ionization disk 148. An ionization disk 148 is a region of space in which a neutral He atom, venturing thereinto, has a high probability of undergoing ionization. Typically, ionization of a neutral He atom occurs via electron tunneling from the neutral He atom to a tip apex atom. Ionization disks 148 therefore represent spatial regions in which He ions are generated, and from which the He ions emerge.

The sizes of the ionization disks 148 for particular tip apex atoms are dependent upon the shape of tip apex 187 and the electrical potential applied to tip apex 187. In general, ionization of He atoms can occur in spatial regions adjacent to tip apex 187 where the local electric field exceeds the ionization potential of He atoms. For a large electric potential applied to tip apex 187, therefore, many tip atoms will have ionization disks. In addition, the local electric field in the vicinity of tip apex 187 depends upon the shape of tip apex 187. For a relatively sharp tip apex, the local electric field in the vicinity of tip apex 187 will be relatively high. For a relatively blunt tip apex, the local electric field, even in the vicinity of tip apex 187, will be smaller.

Ionization disks 148 corresponding to individual atoms of tip apex 187 are spatially separated from one another in FIG. 10. In some embodiments, if the electric field of tip apex 187 is sufficiently large, ionization disks from more than one atom (e.g., atoms 142) can overlap spatially, creating a larger ionization disk that spans a region of space proximal to multiple tip apex atoms. By reducing the electric field at tip apex 187, the volume of space occupied by ionization disks 148 can be reduced, and the geometry depicted in FIG. 10 can be realized where a few tip apex atoms each have their own individual, spatially separated ionization disks. Because, in many instances, the shape of tip apex 187 is not easily altered during use of ion source 120, the electric field in the vicinity of tip apex 187 is typically controlled by adjusting the electrical potential applied to tip apex 187.

By further reducing the potential applied to tip apex 187, some of the ionization disks in FIG. 10 can be eliminated. For example, tip apex 187 is not as sharp in the vicinity of second atomic shelf atoms 144, and by reducing the potential applied to tip apex 187, the electric field of tip apex 187 in the vicinity of atoms 144 can be reduced so that He atom ionization does not occur with high probability in these regions. As a result, ionization disks corresponding to atoms 144 are no longer present. However, the electric field of tip apex 187 in the vicinity of terminal shelf atoms 142 can still be high enough to cause He atom ionization, and so ionization disks 148 corresponding to atoms 142 remain. By carefully controlling the electrical potential applied to tip apex 187, ion source 120 can operate so that the only ionization disks present correspond to terminal shelf atoms 142, and the ionization disks corresponding to the terminal shelf atoms are spatially separated from one another. As a result, a He atom that is ionized in the vicinity of tip apex 187 is produced via ionization in the vicinity of a particular terminal shelf atom.

Neutral He atoms 182 have a higher probability of undergoing ionization the longer they remain within ionization disks 148. The polarization of He atoms which is induced by the electric field of tip apex 187, and which causes polarized He atoms to move toward tip apex 187, further ensures that the polarized He atoms remain bound to tip apex 187, increasing the amount of time that the He atoms 182 remain within ionization disks 148, and increasing the probability of ionization of the polarized He atoms over time.

Polarized He atoms can also move from one position to another along the surface of tip apex 187. Because the attractive force between a polarized He atom and tip apex 187 depends on the local strength of the electric field of tip apex 187 at the position of the polarized He atom, the motion of polarized He atoms tends to transport the atoms toward the end of tip apex 187 of tip 186 (e.g., toward terminal shelf 142) where the local electric field is highest. This transport mechanism of polarized He atoms, in combination with control over the electrical potential applied to tip 186 (e.g., to ensure that discrete ionization disks corresponding to only terminal shelf atoms 142 are present), can be used to operate ion source 120 such that a He ion beam 192 is produced by gas field ionization source 120, where individual He ions in the ion beam are generated via the interaction of He gas with one of the terminal shelf atoms 142. Ion beam 192 therefore includes a plurality of He ions from each of the terminal shelf atoms 142, where each He ion can be attributed to ionization at one of the terminal shelf atoms 142.

As discussed above, in general, the size and shape of ionization disks 148 can be modified by changing the electrical potential applied to tip apex 187, and adjacent ionization disks 148 can be made to overlap with a suitably large applied potential, or maintained spatially distinct from one another by a suitably small applied potential. Typically, ionization disks 148 are spaced from tip atoms 142, 144, and 146 by a distance of approximately 0.4 nm. Individual ionization disks corresponding to tip atoms typically have a thickness of approximately 0.02 nm, measured in a direction along a line joining a given disk and its corresponding atom. Ionization disks 148 typically have a diameter, measured in a direction normal to the line joining a given disk and its corresponding atom, of approximately the diameter of the corresponding atom.

Figure 11:
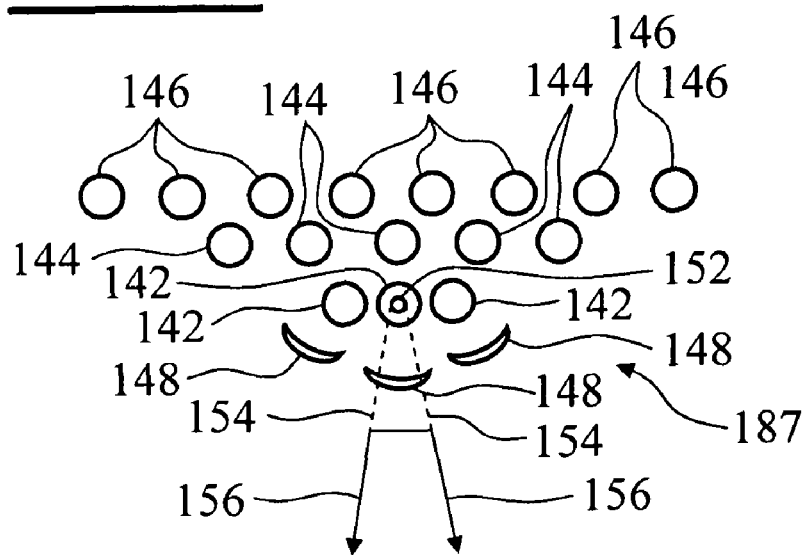
FIG. 11 is a schematic representation of an enlarged side view of the tip of FIG. 10.

FIG. 11 shows an operating configuration of tip apex 187 where the electrical potential applied to tip 186 produces three ionization disks 148, each of which corresponds to one of three terminal atomic shelf atoms 142. Once He ions are produced in the vicinity of tip apex 187, they are rapidly accelerated away from the tip due to the large positive tip potential. He ions are accelerated away from tip apex 187 along a plurality of trajectories. Two such trajectories 156 are shown in FIG. 11. As depicted in FIG. 11, trajectories 156 correspond to the left- and right-hand limits of the full width at half maximum (FWHM) trajectory distribution for the middle terminal shelf atom. As such, if trajectories 156 are extrapolated backwards (e.g., along lines 154) to the position of the middle terminal shelf atom, they define a virtual source 152 for the middle terminal shelf atom. The diameter of virtual source 152 is typically smaller than the diameter of the middle terminal shelf atom, and may be much smaller than the diameter of the middle terminal shelf atom (e.g., by a factor of 2 or more, a factor of 3 or more, a factor of 5 or more, a factor of 10 or more). Similar considerations apply to the other terminal shelf atoms, and each terminal shelf atom has a corresponding virtual source size.

The small virtual source size for terminal shelf atoms can provide a number of advantages. For example, the small virtual source size of ion beam 192 and the relatively small thickness of the ionization disk 148 from which ions in ion beam 192 arise can assist in ensuring that ion beam 192 has a relatively high brightness and a relatively narrow ion energy distribution.

Without wishing to be bound by theory, it is believed that using a tip temperature that is too low can negatively impact current stability and/or increase undesirable effects from increased impurity adsorption on the tip. In general, the temperature of tip 186 is 5K or more (e.g., 10 K or more, 25K or more, 50K or more 75K or more), and/or 100K or less (e.g., 90K or less, 80K or less). For example, the temperature of tip 186 can be from 5K to 100K (e.g., from 25K to 90K, from 50K to 90K, from 75K to 80K). The temperature of tip 186 can be attained by thermal coupling with a coolant, such as, for example, liquid helium or liquid nitrogen. Alternatively or additionally, tip 186 can be thermally cooled using a cryogenic refrigerator.

It is believed that, if the temperature of tip 186 is too low, the rate at which adsorbed He atoms are transported by moving to atoms 142 in the terminal atomic shelf of tip apex 187 is reduced so that not enough He atoms per unit time reach atoms 142 where they can be ionized. As a result, when the emission pattern of tip 186 is observed (e.g., by using field ion microscope (FIM) techniques, or by scanning FIM (SFIM) techniques), the abundance of ions from individual terminal shelf atoms alternates from relatively high abundance to relatively low abundance (commonly referred to as blinking). This can occur, for example, when there are no He atoms available for ionization in the vicinity of the terminal shelf atom at certain times. As the temperature of tip 186 is increased, the transport rate of He atoms toward the terminal shelf of atoms of tip apex 187 increases, and the observation of this alternating high/low abundance from terminal shelf atoms 142 is reduced or eliminated.

It is also believed that, if the temperature of tip 186 is too high, polarized He atoms will have too much kinetic energy to remain bound to tip 186 for sufficiently long periods of time to ensure efficient ionization of He atoms in the vicinity of terminal shelf atoms 142. This can also result in disappearance of the emission pattern from individual terminal shelf atoms as observed using FIM and/or SFIM imaging techniques. As a result, to ensure that the He ionization process at each of the terminal shelf atoms 142 produces stable ion currents from each of the terminal shelf atoms 142, the temperature of tip 186 is carefully controlled to mitigate against both undesirable high- and low-temperature effects.

In general, ion optics 130 are configured to direct ion beam 192 onto surface 181 of sample 180. As described in more detail below, ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic and other ion optical elements that are configured as desired. By manipulating the electric field strengths of one or more components (e.g., electrostatic deflectors) in ion optics 130, He ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181.

When ion beam 192 impinges on sample 180, a variety of different types of particles 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of particles resulting from the interaction between He ion beam 192 and sample 180. As shown in FIG. 8, detector 150 is positioned to detect particles 194 that originate primarily from surface 181 of sample 180, and detector 160 is positioned to detect particles 194 that emerge primarily from surface 183 of sample 180 (e.g., transmitted particles). As described in more detail below, in general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 180. Typically, this information is determined by obtaining one or more images of sample 180. By rastering ion beam 192 across surface 181, pixel-by-pixel information about sample 180 can be obtained in discrete steps. Detectors 150 and/or 160 can be configured to detect one or more different types of particles 194 at each pixel. Typically, a pixel is a square, although in some embodiments, pixels can have different shapes (e.g., rectangular). A pixel size, which corresponds to a length of a side of the pixel, can be, for example, from 100 pm to two μm (e.g., from one nm to one μm). In some embodiments, the location of adjacent pixels can be determined to within at least 200 pm (e.g., to within at least 100 pm, to within at least 75 pm, to within at least 50 pm). Thus, the operator of the system can determine the location of the center of the beam spot to within at least 200 pm (e.g., to within at least 100 pm, to within at least 75 pm, to within at least 50 pm). In certain embodiments, the field of view (FOV) of sample 180 is 200 nm or more (e.g., 500 nm or more, 1 μm or more, 50 μm or more, 100 μm or more, 500 μm or more, 1 mm or more, 1.5 mm or more), and/or 25 mm or less (15 mm or less, 10 mm or less, five mm or less). The field of view refers to the area of a sample surface that is imaged by the ion microscope.

The operation of microscope system 100 is typically controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180 (e.g., topography information, material constituent information, crystalline information, voltage contrast information, optical property information, magnetic information), which can optionally be in the form of an image, a graph, a table, a spreadsheet, or the like. Typically, electronic control system 170 includes a user interface that features a display or other kind of output device, an input device, and a storage medium.

Electronic control system 170 can also be configured to scan ion beam 192 over a surface of sample 180 according to the scanning protocols disclosed herein. For example, electronic control system 170 can be configured to permit manual (e.g., operator assisted) input of various scanning parameters such as the number and spacings of portions M in a scanning protocol. Alternatively, or in addition, electronic control system 170 can be configured to determine various scanning parameters automatically (e.g., the number and spacings of portions M) based on input information (e.g., incident ion energy, sample material). In general, electronic control system 170 can be configured to implement any of the scanning protocols disclosed herein in microscope system 100, with varying levels of automation from fully automatic operation to manual operation.

A. Overview

Figure 12:
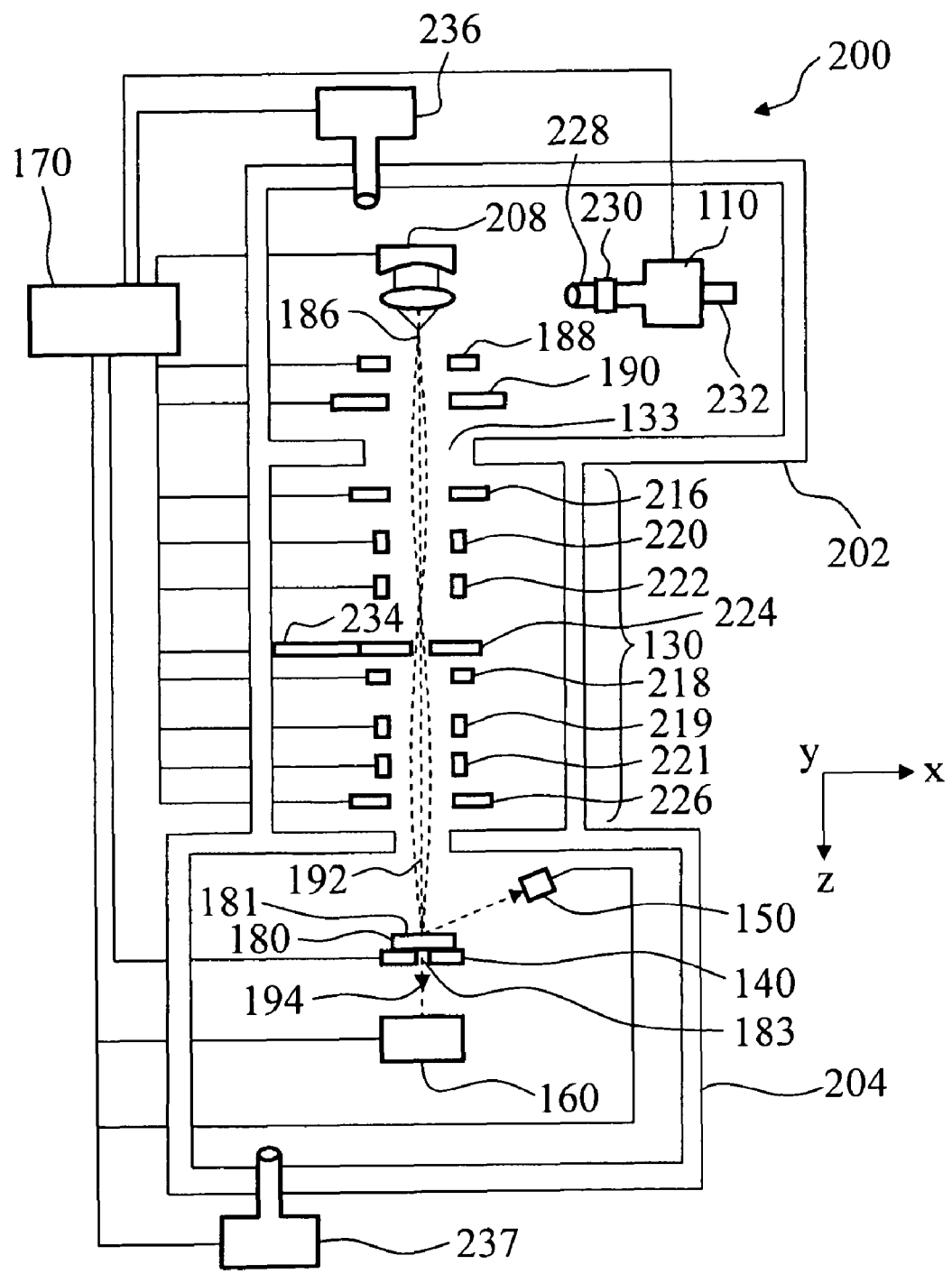
FIG. 12 is a schematic diagram of a helium ion microscope system.

FIG. 12 shows a schematic diagram of a He ion microscope system 200. Microscope system 200 includes a first vacuum housing 202 enclosing a He ion source and ion optics 130, and a second vacuum housing 204 enclosing sample 180 and detectors 150 and 160. Gas source 110 delivers He gas to microscope system 200 through a delivery tube 228. A flow regulator 230 controls the flow rate of He gas through delivery tube 228, and a temperature controller 232 controls the temperature of He gas in gas source 110. The He ion source includes a tip 186 affixed to a tip manipulator 208. The He ion source also includes an extractor 190 and a suppressor 188 that are configured to direct He ions from tip 186 into ion optics 130. Ion optics 130 include a first lens 216, alignment deflectors 220 and 222, an aperture 224, an astigmatism corrector 218, scanning deflectors 219 and 221, and a second lens 226. Aperture 224 is positioned in an aperture mount 234. Sample 180 is mounted in/on a sample manipulator 140 within second vacuum housing 204. Detectors 150 and 160, also positioned within second vacuum housing 204, are configured to detect particles 194 from sample 180. Gas source 110, tip manipulator 208, extractor 190, suppressor 188, first lens 216, alignment deflectors 220 and 222, aperture mount 234, astigmatism corrector 218, scanning deflectors 219 and 221, sample manipulator 140, and/or detectors 150 and/or 160 are typically controlled by electronic control system 170. Optionally, electronic control system 170 also controls vacuum pumps 236 and 237, which are configured to provide reduced-pressure environments inside vacuum housings 202 and 204, and within ion optics 130.

B. Ion Source

Figure 13:
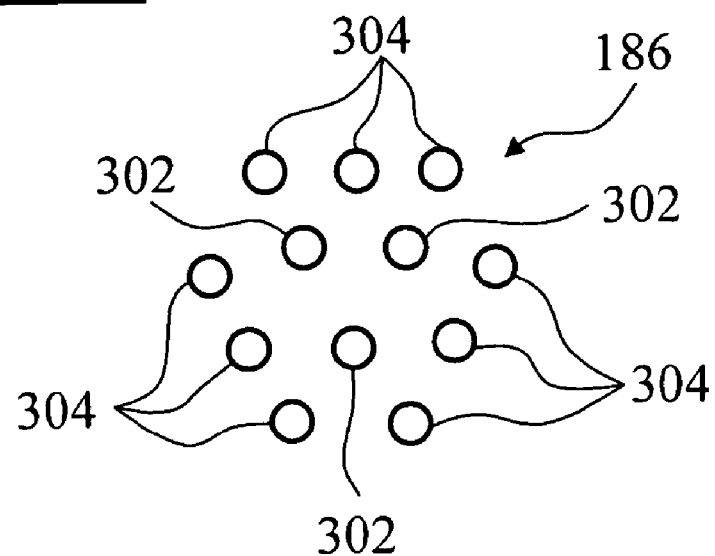
FIG. 13 is a schematic representation of an enlarged top view of an embodiment of a W(111) tip.
Figure 14:
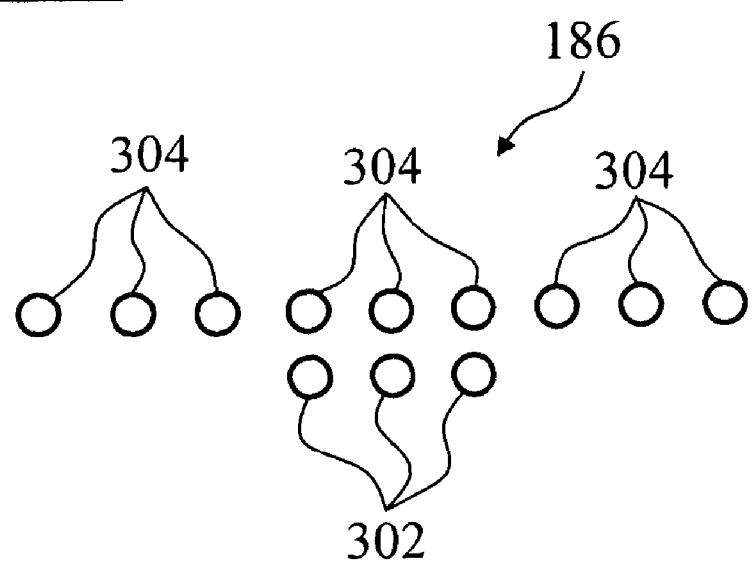
FIG. 14 is a schematic representation of an enlarged side view of the W(111) tip of FIG. 13.

As noted above, in general, tip 186 can be formed of any appropriate electrically conductive material. In certain embodiments, tip 186 can be formed of a single crystal material, such as a single crystal metal. Typically, a particular single crystal orientation of the terminal shelf of atoms of tip apex 187 is aligned with a longitudinal axis of tip 186 to within 3° or less (e.g., within 2° or less, within 1° or less). In some embodiments, apex 187 of tip 186 can terminate in an atomic shelf having a certain number of atoms (e.g., 20 atoms or less, 15 atoms or less, 10 atoms or less, nine atoms or less, six atoms or less, three atoms or less). For example, apex 187 of tip 186 can be formed of W(111) and can have a terminal shelf with three atoms (a trimer). FIGS. 13 and 14 show schematic representations of enlarged top and side views, respectively, of the two atomic shelves of a W tip 186 that are nearest to the apex of tip. The terminal shelf, which includes three W atoms 302 arranged in a trimer, corresponds to a (111) surface of W. Without wishing to be bound by theory, it is believed that this trimer surface is advantageous (in terms of its ease of formation, re-formation and stability) because the surface energy of the W(111) crystal face favorably supports a terminal shelf formed by three W atoms arranged in an equilateral triangle to form a trimer. The trimer atoms 302 are supported by a second shelf of W atoms 304.

In some embodiments, tip 186 can have a terminal shelf that includes fewer than three atoms or more than three atoms. For example, a W(111) tip can have a terminal shelf that includes two atoms, or a terminal shelf that includes only one atom. Alternatively, a W(111) tip can have a terminal shelf that includes four or more atoms (e.g., five or more atoms, six or more atoms, seven or more atoms, eight or more atoms, nine or more atoms, ten or more atoms, more than ten atoms).

Alternatively, or in addition, tips that correspond to other W crystalline orientations (e.g., W(112), W(110) or W(100)) can be used, and such tips can have terminal shelves that include one or more atoms (e.g., two or more atoms, three or more atoms, four or more atoms, five or more atoms, six or more atoms, seven or more atoms, eight or more atoms, nine or more atoms, ten or more atoms, more than ten atoms).

In some embodiments, tips formed from a material other than single crystal W can be used in the ion source (e.g., a single crystal of a metal, such as a single crystal of one of the metals noted above), and such tips can have terminal shelves that include one or more atoms (e.g., two or more atoms, three or more atoms, four or more atoms, five or more atoms, six or more atoms, seven or more atoms, eight or more atoms, nine or more atoms, ten or more atoms, more than ten atoms).

As described below, the shape of tip apex 187 can have an impact on the quality of the ion beam, which can have an impact on the performance of microscope system 200. For example, when viewed from the side, tip apex 187 can be symmetrically formed about its longitudinal axis, or it can be asymmetrically formed about its longitudinal axis. In certain embodiments, from one or more side views, tip apex 187 may be symmetrically formed about its longitudinal axis, and, from one or more different side views, tip apex 187 may be asymmetrically formed about its longitudinal axis.

Figure 15:
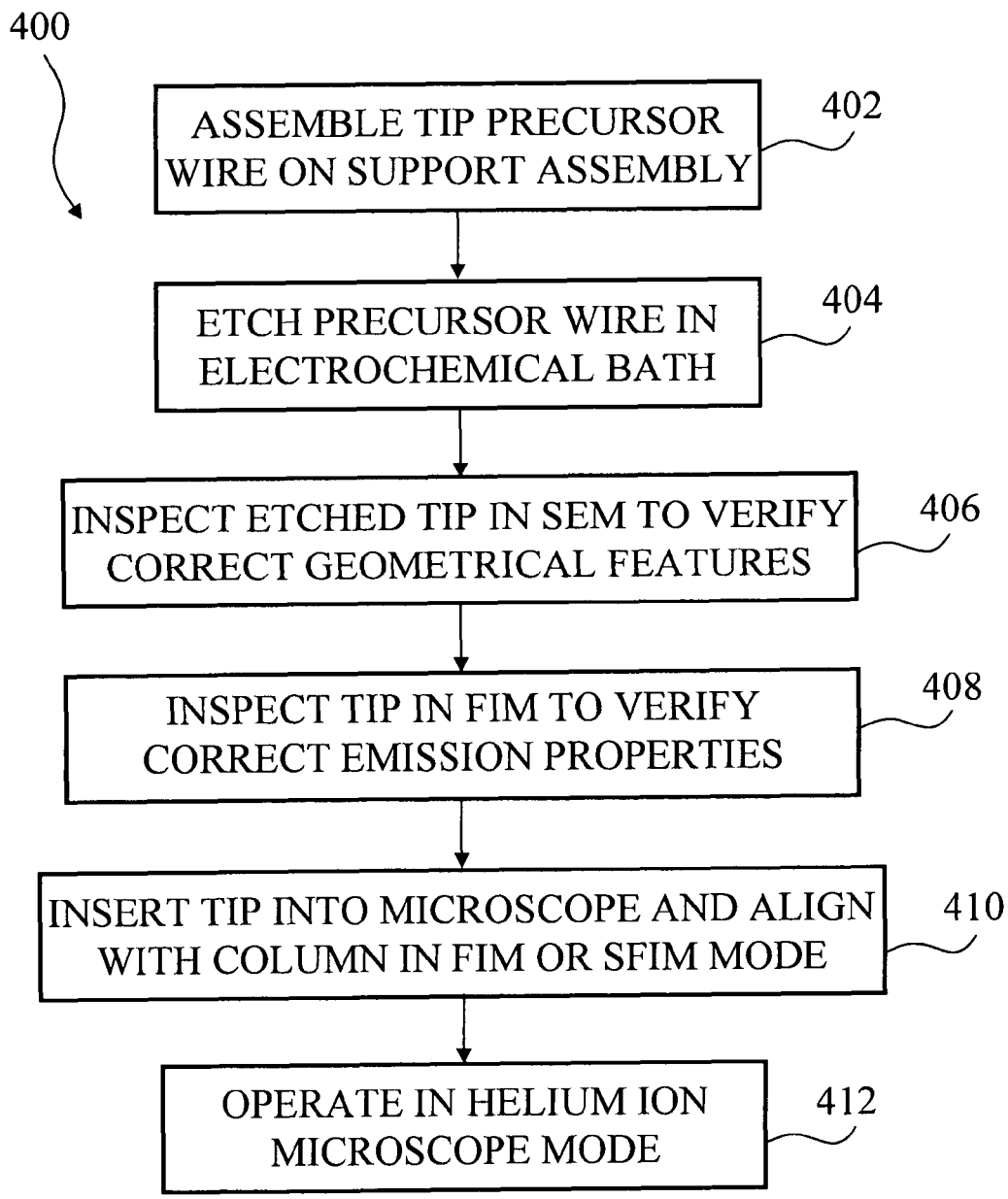
FIG. 15 is a flow chart showing an embodiment of a method of making a tip.

FIG. 15 is a flow chart for a process 400 of making a W(111) tip having a terminal atomic shelf that is a trimer. In a first step 402, a single crystal W(111) precursor wire is attached to a support assembly. In a second step 404, the precursor wire is etched in an electrochemical bath to shape the tip of the wire. Then, in step 406 of process 400, the etched tip is examined to verify that the tip has suitable geometrical features. Determination of geometrical features typically includes obtaining profile images of the etched tip and calculating various geometrical parameters from data obtained from the profile images. The inspection can be performed using a SEM, for example.

Subsequently, in step 408, the terminal shelf of the apex of the tip of the etched wire is formed into a trimer. This process generally involves imaging the tip (e.g., using FIM or SFIM) and shaping the tip (e.g., using field evaporation). Then, in step 410 of process 400, apex 187 of tip 186 is aligned within system 200. With the support assembly installed in microscope system 200, microscope system 200 is evacuated using one or more vacuum pumps, and then heat is applied to tip 187 to remove, for example, oxides, condensates, and/or any other impurities that may have adhered to the tip surface. Typically, for example, tip 186 is heated to a temperature of 900 K or more (e.g., 1000 K or more, 1100 K or more) for a duration of 10 s or more (e.g., 30 s or more, 60 s or more). Heating may also assist in re-faceting tip 186, in the event that the tip shape is compromised by the presence of impurities.

With tip 186 aligned within system 200, and the He ion beam aligned so that a portion of ion beam 192 passes through aperture 224, microscope system 200 can be operated in He ion mode in step 412 of process 400.

To verify the integrity of tip 186, the field emission pattern from tip 186 can be periodically monitored by operating microscope system 200 in FIM or SFIM mode. If the trimer structure remains intact at tip apex 187, then tip 186 can continue to be used to provide ion beam 192 to microscope system 200. However, under certain circumstances, FIM or SFIM imaging of tip 186 may reveal that the trimer structure is no longer intact on tip apex 187. In this case, tip 186 can first be field evaporated to round the tip and remove the damaged trimer structure, and then re-sharpened in situ (e.g., without removing tip 186 from microscope system 200) using a process as described above. Methods of forming and inspecting tips, and aligning tips in microscope systems, are disclosed, for example, in previously-incorporated U.S. patent application Ser. No. 11/600,711 entitled "ION SOURCES, SYSTEMS AND METHODS" by Billy W. Ward et al., filed on Nov. 15, 2006, now published as U.S. Publication No. US 2007/0158558.

Figure 16:
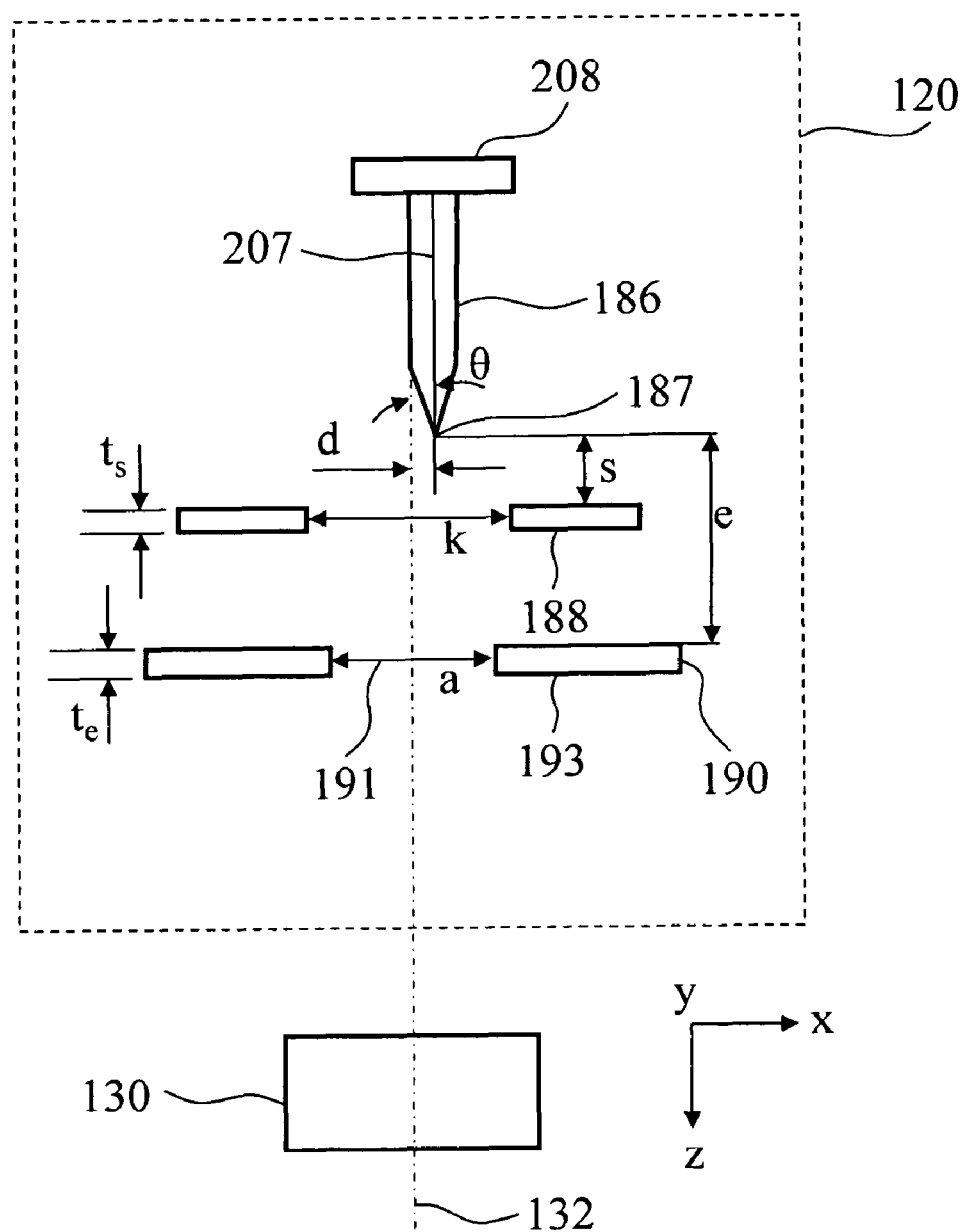
FIG. 16 is a schematic view of an embodiment of a gas field ion source and ion optics.

Referring to FIG. 16, alignment of tip 186 in microscope system 200 includes aligning a longitudinal axis 207 of tip 186 with a longitudinal axis 132 of ion optics 130 so that the distance d between axes 207 and 132 at apex 187 of tip 186 is less than 2 mm (e.g., less than 1 mm, less than 500 μm, less than 200 μm). In some embodiments, the angle between axes 207 and 132 at apex 187 of tip 186 is 2° or less (e.g., 1° or less, 0.5° or less, 0.2° or less).

Extractor 190 includes an opening 191. In general, the shape of extractor 190 and of opening 191 can be selected as desired. Typically, these features are chosen to ensure that He ions are efficiently and reliably directed into ion optics 130. In some embodiments, extractor 190 is positioned further in the +z direction than tip 186, as shown in FIG. 16. In certain embodiments, extractor 190 is positioned further in the −z direction than tip 186. In such embodiments, for example, tip 186 protrudes through extractor 190 and extends further along the z-axis in the +z direction than extractor 190. While extractor 190 is shown as having a particular configuration in FIG. 16, more generally, extractor 190 can be of any desired design. For example, in some embodiments, opening 191 can have curved sides of any desired shape.

Extractor 190 can generally be biased either positively or negatively with respect to tip 186. In some embodiments, the electrical potential applied to extractor 190 is −10 kV or more (e.g., −5 kV or more, 0 kV or more), and/or 20 kV or less (e.g., 15 kV or less, 10 kV or less) with respect to tip 186.

Optionally, suppressor 188 can also be present in the vicinity of tip 186. Suppressor 188 can be used, for example, to alter the electric field distribution in the vicinity of tip 186 by adjusting the potential applied to suppressor 188. Together with extractor 190, suppressor 188 can be used to control the trajectory of He ions produced at tip 186. In certain embodiments, as shown in FIG. 16, suppressor 188 is positioned further along in the +z-direction than tip 186. In some embodiments, tip 186 is positioned further along in the +z-direction than suppressor 188, so that tip 186 extends through suppressor 188 in the +z-direction.

In general, microscope system 200 can be configured so that after passing through extractor 190, the energy of the ions in ion beam 192 can be selected as desired. Typically, the average energy of the ions in ion beam 192 is 5 keV or more (e.g., 10 keV or more, 20 keV or more, 30 keV or more) and/or 100 keV or less (e.g., 90 keV or less, 80 keV less, 60 keV or less, 50 kV or less, 40 kV or less, 30 kV or less) after passing through entry opening 133 to ion optics 130. For example, in some embodiments, after passing through entry opening 133, the energy of the ions in ion beam 192 is from 5 keV to 100 keV (e.g., from 10 keV to 90 keV, from 20 keV to 80 keV). For example, in embodiments where it is desirable to detect ions that are transmitted through a sample, higher ion energies (e.g., 50 keV to 100 keV) may be used.

Further, in certain embodiments, the energy of the ions in ion beam 192 can be changed without changing the ion current. That is, the electrical potential applied to tip 186 can be adjusted to modify the average energy of ion beam 192 without substantially changing the ion beam current from ion beam 192.

Ion optics 130 generally include one or more elements such as lenses, deflectors, and filters, that can be used to collimate, focus, deflect, and shape the ion beam emerging from ion source 120 prior to the beam impinging on a sample.

Exemplary dimensions, voltages, and other settings for various components of microscope system 200 are disclosed, for example, in U.S. patent application Ser. No. 11/600,711 entitled "ION SOURCES, SYSTEMS AND METHODS" by Billy W. Ward et al., filed on Nov. 15, 2006, now published as U.S. Publication No. US 2007/0158558, the entire contents of which are incorporated herein by reference.

C. Detectors

Detectors 150 and 160 are depicted schematically in FIG. 12, with detector 150 positioned to detect particles from surface 181 of sample 180 (the surface on which the ion beam impinges), and detector 160 positioned to detect particles from surface 183 of sample 180. In general, a wide variety of different detectors can be employed in microscope system 200 to detect different particles, and a microscope system 200 can typically include any desired number of detectors. The configuration of the various detector(s) can be selected in accordance with particles to be measured and the measurement conditions. In some embodiments, a spectrally resolved detector may be used. Such detectors are capable of detecting particles of different energy and/or wavelength, and resolving the particles based on the energy and/or wavelength of each detected particles. In certain embodiments, a spectrally resolved detector includes componentry capable of directing particles to different regions of the detector based on the energy and/or wavelength of the particle.

Certain exemplary detectors and arrangements of detectors are described below. Detection systems and methods are also generally disclosed, for example, in previously-incorporated U.S. patent application Ser. No. 11/600,711 entitled "ION SOURCES, SYSTEMS AND METHODS" by Billy W. Ward et al., filed on Nov. 15, 2006, now published as U.S. Publication No. US 2007/0158558.

(i) Everhart-Thornley Detectors

Figure 17:
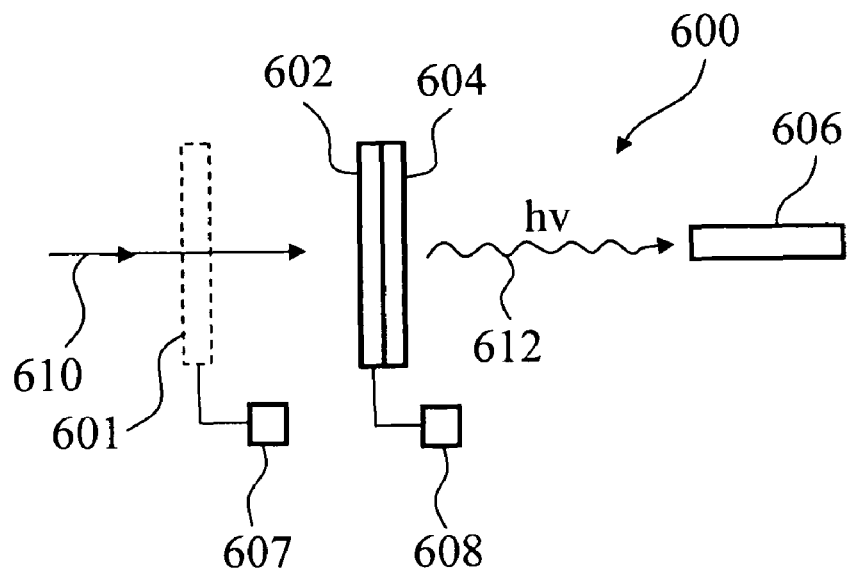
FIG. 17 is a schematic diagram of an Everhart-Thornley detector.

An Everhart-Thornley (ET) detector can be used to detect secondary electrons, ions, and/or neutral particles. FIG. 17 shows a schematic diagram of an ET detector 600 that includes a particle selector 601, a conversion material 602, a support 604, a photon detector 606, and voltage sources 607 and 608.

During operation, voltage source 607 applies a voltage of relatively small magnitude (e.g., 500 V or less, such as from 100 V to 500 V) to particle selector 601 (formed of a conductive material), and voltage source 608 applies a voltage of relatively large magnitude (e.g., 5 kV or more, 10 kV or more) to conversion material 602. In embodiments in which the ET detector is used to measure electrons from sample 180 (e.g., secondary electrons), the sign of the voltage applied to particle selector 601 and conversion material 602 is positive with respect to sample 180. In embodiments in which the ET detector is used to measure ions from sample 180 (e.g., secondary ions, scattered ions), the sign of the voltage applied to particle selector 601 and conversion material 602 is negative with respect to sample 180. In certain embodiments, sample 180 can also be biased (with respect to the common external ground) to assist in delivering particles from sample 180 to detector 600. For example, when the ET detector is used to measure secondary electrons from sample 180, the sample can be negatively biased relative to the common external ground. Applying a negative potential bias to manipulator 140 may be particularly useful, for example, when detecting secondary electrons generated in a high aspect ratio (e.g., deep) hole or via in the sample. The negative potential bias relative to the common external ground can assist in accelerating electrons out of the hole or via and away from the sample, making detection of the electrons easier. In the absence of the negative bias, many of the secondary electrons might instead re-enter the sample at points along the hole or via walls, never escaping the hole or via to be detected.

Sample 180 can be positively biased, for example, when the ET detector is used to measure ions from the sample. The magnitude of the electrical potential applied to bias the sample can be 5 V or more (e.g., 10 V or more, 15 V or more, 20 V or more, 30 V or more, 50 V or more, 100 V or more).

Charged particles 610 (e.g., electrons or ions) from sample 180 are attracted to particle selector 601, pass through particle selector 601, and are accelerated toward conversion material

602. Charged particles 610 then collide with conversion material 602, generating photons 612. Photons 612 pass through support 604 and are detected by photon detector 606.

An ET detector can be located at any position relative to sample 180 to detect neutral or charged particles. Typically, for example, an ET detector is positioned adjacent to second lens 226 of ion optics 130. Optionally, an ET detector can also be positioned such that it is tilted downward slightly towards sample 180 (e.g., in a similar configuration as that depicted for detector 150 in FIG. 12).

In certain embodiments, an ET detector can be positioned in the vicinity of surface 183 of sample 180. Such a configuration may be desirable, for example, when seeking to measure secondary electrons from sample 180 that emerge from surface 183 (e.g., after being transmitted through sample 180). In such embodiments, the ET detector can have a configuration that is similar to the configuration of detector 160 in FIG. 12.

(ii) Microchannel Plate Detectors

In some embodiments, a microchannel plate detector can be used to amplify a flux of secondary electrons, neutral atoms, or ions from a sample. Microchannel plates are typically formed from materials such as fused silica, and generally include a large number of small diameter channels arranged in the form of an array. Particles enter individual channels and collide with channel walls, generating free electrons. Typically, multiple free electrons are generated on each collision of a particle (neutral atom, ion, or electron) with a channel wall. As a result, a cascaded electron signal corresponding to an amplification of the input particle signal exits the microchannel plate.

Microchannel plate-based detectors (which can include one or more microchannel plates) can be configured to detect ions, secondary electrons, and/or neutral atoms from sample 180. Neutral particles and/or ions (e.g., secondary ions and atoms, scattered ions and primary atoms) formed from sample 180 typically leave surface 181 of sample 180 (the surface on which the ion beam impinges). Accordingly, microchannel plate-based detectors configured to measure neutrals and/or ions from sample 180 are generally located at positions similar to the position of detector 150 depicted in FIGS. 8 and 12. However, in certain embodiments, neutral particles and/or ions (e.g., transmitted ions) can be investigated. In such embodiments, a microchannel plate-based detector can be located at positions similar to the position of detector 160 in FIGS. 8 and 12. Secondary electrons can be detected either from surface 181 (the surface on which the ion beam impinges) and/or surface 183 of sample 180 (the surface on the opposite side from where the ion beam impinges), and microchannel plate-based detectors configured to detect secondary electrons from sample 180 are located at positions similar to detector 150 and/or detector 160 as depicted in FIGS. 10 and 14.

Microchannel plates amplify an incoming particle signal and convert the incoming signal to an outgoing electron signal. To visualize the outgoing electron signal, microchannel plate-based detectors can also include a conversion material, a screen, and a photon detector (see discussion above).

Figure 18:
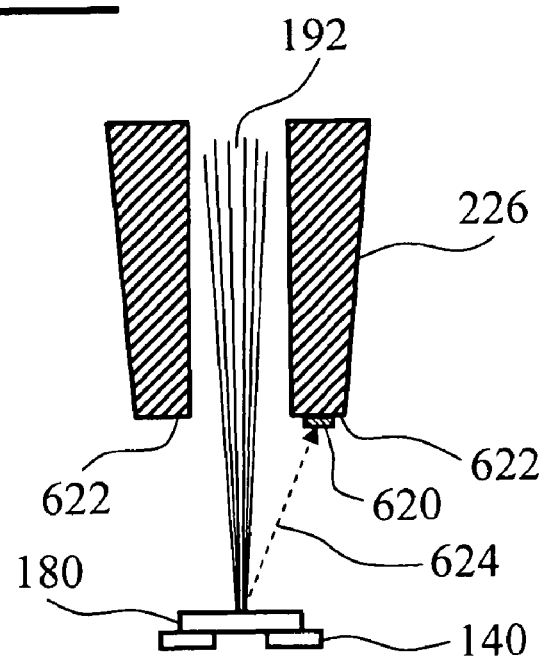
FIG. 18 is a cross-sectional view of a portion of a gas field ion microscope system including a microchannel plate detector.

In some embodiments, microchannel plates are affixed directly to elements of ion optics 130. FIG. 18 shows a cross-sectional view of a microchannel plate detector 620 mounted directly to an electrostatic lens 226. Lens 226 has a conical shape, with a flat lower surface 622. Detector 620 is mounted directly to surface 622. When sample 180 is exposed to ion beam 192, ions, secondary electrons, and/or neutral atoms from sample 180 (collectively indicated by arrow 624) can be detected by microchannel plate detector 620. Detector 620 registers a current that is proportional to the detected particle flux, which can be conveyed to electronic control system 170.

(iii) Conversion Plates

In some embodiments, a conversion plate can be used to detect ions (e.g., scattered ions, secondary ions) from a sample or neutral particles (e.g., primary neutral He atoms) from the sample. Typically, a conversion plate can be formed from a thin foil material that, when struck by an incident ion or atom, has a high secondary electron yield. An example of such a material is platinum. The secondary electron yield produces an abundance of secondary electrons that are readily detected, for example, by an appropriate electron detector configured, for example, as detectors 150 and/or 160 (FIGS. 8 and 12).

(iv) Channeltron Detectors

Channeltron detectors can also be used to detect particles such as electrons, ions and neutral atoms leaving a sample. Channeltron detectors function by amplifying particle signals through multiple internal collisions in a manner similar to that described in connection with microchannel plate detectors. Measurement of relatively weak secondary electron, ion, or neutral atom fluxes from sample 180 is possible by measuring the amplified particle signals that are output by a channeltron detector (e.g., using electronic control system 170). When measuring secondary electrons from sample 180, a channeltron detector can be located in a position similar to that depicted for detector 150 and/or detector 160 in FIGS. 10 and 14. Typically, for the measurement of ions and/or neutral particles from sample 180, a channeltron detector is located in a position similar to the position of detector 150 and/or the position of detector 160 as depicted in FIGS. 8 and 12.

(v) Phosphor Detectors

Phosphor-based detectors, which include a thin layer of a phosphor material deposited atop a transparent substrate, and a photon detector such as a CCD camera, a PMT, or one or more diodes, can be used to detect electrons, ions and/or neutral particles from a sample. Particles strike the phosphor layer, inducing emission of photons from the phosphor which are detected by the photon detector. Phosphor-based detectors can be arranged in positions similar to those of detector 150 and/or detector 160 as depicted in FIGS. 8 and 12, depending upon the type of particle that is measured (see discussion above).

(vi) Solid State Detectors

Solid state detectors can be used to detect secondary electrons, ions, and/or neutral atoms from a sample. A solid state detector can be constructed from a sensor formed of a material such as silicon, or a doped silicon material. When incident particles strike the sensor, electron-hole pairs are created in the sensor material, producing a current that can be detected by electronic control system 170. The number of electron-hole pairs generated by an incident particle, and therefore the corresponding magnitude of the current produced, depends in part upon the particle's energy. Thus, a solid state detector can be particularly useful for energy measurements of particles, which can be especially advantageous when detecting high energy particles (e.g., scattered He ions and neutral He atoms) from sample 180.

(vii) Scintillator Detectors

Similar to phosphor-based detectors, scintillator-based detectors include a scintillator material that generates photons in response to being struck by an incident particle (electron, ion, or neutral atom). Suitable scintillator materials include, for example, YAG and YAP. The photon yield in scintillator-based detectors depends on the energy of the incident particles. As a result, a scintillator detector can be particularly useful for energy measurements of particles, which can be especially advantageous when detecting high energy particles (e.g., scattered He ions and neutral He atoms) from sample 180.

(viii) Energy Detectors for Ions

A variety of different detectors and detection schemes can be implemented to measure energies of ions (e.g., scattered He ions) from a sample. Electrostatic prism detectors, in which an electric and/or magnetic field is used to deflect incident ions, where the amount of deflection depends on the energy of the ions, can be used to spatially separate ions with different energies. Magnetic prism detectors may also be used to spatially separate ions based on the energy of the ions. Any of the suitable detectors discussed above (e.g., microchannel plates, channeltrons, and others) can then be used to detect the deflected ions.

Quadrupole detectors can also be used to analyze energies of ions from a sample. In a quadrupole detector, a radiofrequency (RF) field within the quadrupole ensures that ions having a chosen mass and energy propagate along a straight, undeflected trajectory within the quadrupole. Ions with a different mass and/or energy propagate along a curved trajectory within the quadrupole. From the deflected position of ions within the quadrupole analyzer, energies of the ions can be determined.

In some embodiments, ion energy can be determined by placing a positively biased particle selector (e.g., a screen or mesh of electrically conductive material, or a cylindrical metal tube or ring) along the flight path of the ions and in front of the detector. The magnitude of the electrical potential applied to particle selector 601 can initially be very high (e.g., a value certain to prevent ions from sample 180 from passing therethrough), and the magnitude of the electrical potential can be reduced while using an appropriate detector (see discussion above) to detect the ions. The current of ions that reach the detector as a function of the magnitude of the potential bias on the particle selector can be used to determine information about the energy of the ions.

(ix) Energy Detectors for Electrons

A variety of different detectors and detection schemes can be implemented to measure energies of electrons (e.g., secondary electrons) from a sample. Prism detectors, in which an electric and/or magnetic field is used to deflect incident electrons, and where the amount of deflection depends on the energy of the electrons, can be used to spatially separate electrons with different energies. Any of the suitable detectors discussed above can then be used to detect the deflected electrons.

In some embodiments, electron energies can be determined by placing a negatively biased particle selector (e.g., a screen or mesh of electrically conductive material, or a cylindrical metal tube or ring) along the flight path of the electrons and in front of the detector. The magnitude of the electrical potential of the particle selector can initially be very high (e.g., a value certain to prevent the electrons from sample 180 from passing therethrough), and the magnitude of the electrical potential can be reduced while using an appropriate detector (see discussion above) to detect the electrons. The electron current that reaches the detector as a function of the magnitude of the applied electrical potential on the particle selector can be used to determine information about the energies of the electrons.

(x) Time-Of-Flight Detectors

The detectors disclosed above can also be configured to measure time-of-flight information for secondary electrons, ions, and neutral atoms. To perform time-of-flight detection, ion beam 192 is operated in pulsed mode. Ion beam 192 can be pulsed, for example, by rapidly changing the electrical potentials applied to one or more beam deflectors. By increasing these potentials, for example, ion beam 192 can be diverted from its usual path in ion optics 130 such that ion beam 192 is temporarily blocked by aperture 224. If the potentials of the deflectors are then returned to their normal values for a short time before being increased again, a pulse of He ions can be delivered to sample 180.

At the same time, detectors 150 and 160 can be synchronized to a clock signal from electronic control system 170 that is based upon the temporal variation in potentials applied to the deflectors. As a result, the time interval between the launch of a He ion pulse and the detection of particles from sample 180 can be accurately measured. From known information about the time of propagation of the He ion pulse within ion optics 130, the time-of-flight of the detected particles between sample 180 and detectors 150 and/or 160 can be determined.

(xi) Angle-Dependent Measurements

In addition to measuring relative abundances and energies of particles from a sample, angle-dependent scattering information can be obtained using the detectors disclosed above. Typically, to acquire angle-dependent information, a detector is affixed to a mount (e.g., a swivel mount) that permits movement of the detector throughout a range of solid angles about sample 180. At a given orientation with respect to sample 180 that corresponds to a particular solid angle, abundance and/or energy measurements of particles are recorded. The detector is sequentially re-positioned at different solid angles and the measurements are repeated to determine the angular dependence of the measured quantities. In some embodiments, a limiting aperture such as a pinhole can be placed in front of the detector in the path of the scattered particles to further restrict the range of angles over which measurement of particles from sample 180 occurs.

(xii) Photon Detectors

To detect photons generated by the interaction of the ions with sample 180, a standard photon detector such as a PMT can be used. If the photon flux emanating from sample 180 is sufficiently large, less sensitive photon detectors such as diodes, diode arrays, and CCD cameras can be used.

In some embodiments, the photon detector can also include various optical elements that can be configured, for example, to isolate a particular optical signal of interest from among other optical signals. For example, in certain embodiments, the photon detector can include optical elements such as filters to select particular wavelength bands in the photon signal emerging from sample 180, which can provide material constituent information about sample 180. The filters can, for example, block photons of undesired wavelengths (e.g., by absorbing photons of undesired wavelengths, by reflecting photons of undesired wavelengths, by diverting photons of undesired wavelengths). In some embodiments, the optical elements can provide spectral resolution (e.g., to measure the spectrum of photons generated by sample 180) by dispersing different wavelengths spatially (e.g., diffractive elements such as one or more gratings, and/or refractive elements such as one or more prisms, and/or one or more spectrometer systems that provide wavelength-resolved detection of photons). In some embodiments, the photon detector can include polarization manipulating elements such as waveplates and/or polarizers. These polarization manipulating elements can be configured to permit photons having only a selected polarization state to reach the PMT, for example, allowing polarization-selective detection of the photon signal emerging from sample 180 (e.g., to assist in determining crystalline orientation information for sample 180). In certain embodiments, the photon detector can also include optical elements such as mirrors, lenses, beamsplitters, and other elements for re-directing and manipulating incident photons (e.g., to increase the solid angle of the photons that are detected).

In general, photon detectors can be positioned to detect photons at any desired angle and distance from sample 180. For example, in certain embodiments, a photon detector can be positioned to detect photons emerging from surface 181 (the surface of sample 180 upon which ion beam 192 is incident), or from surface 183 (the surface of sample 180 opposite to the surface upon which ion beam 192 is incident). Optionally, multiple photon detectors can be used and configured to detect photons from surfaces 181 (the surface on which the ion beam impinges), 183 (the surface on the opposite side from where the ion beam impinges) and/or other surfaces of sample 180.

D. Operational Parameters

Figure 19B:
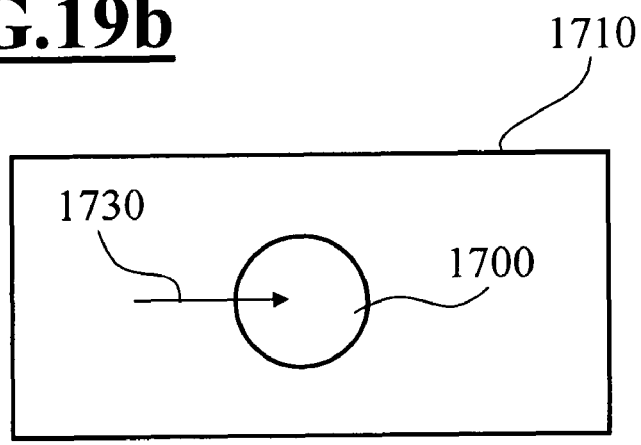
Figure 19C:
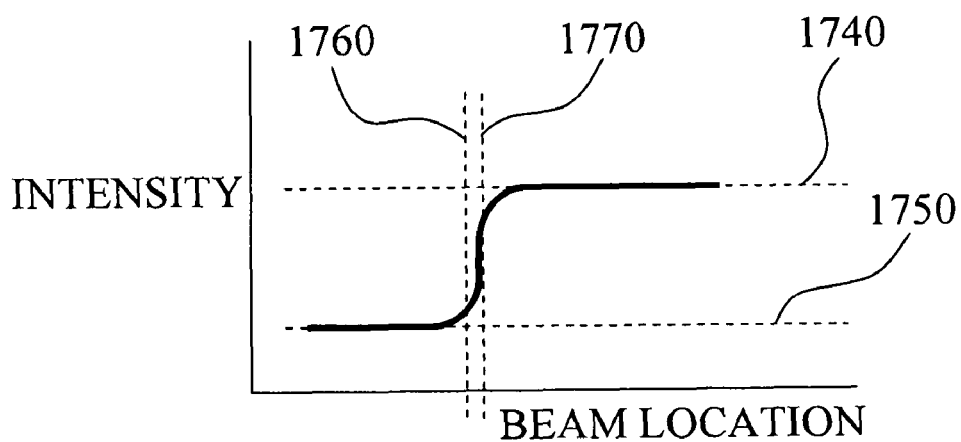
FIG. 19C is a plot of average measured secondary electron total abundance as a function of ion beam position for the sample of FIGS. 19A and 19B.

Ion beam 192 can have a relatively small spot size on surface 181 of sample 180. For example, in some embodiments, the spot size of ion beam 192 on surface 181 of sample 180 can have a dimension of 10 nm or less (e.g., nine nm or less, eight nm or less, seven nm or less, six nm or less, five nm or less, four nm or less, three nm or less, two nm or less, one nm or less). In certain embodiments, the spot size of ion beam 192 on surface 181 of sample 180 has a dimension of 0.05 nm or more (e.g., 0.1 nm or more, 0.2 nm or more, 0.25 nm or more, 0.5 nm or more, 0.75 nm or more, one nm or more, two nm or more, three nm or more). In some embodiments, the spot size of ion beam 192 on surface 181 has a dimension of from 0.05 nm to 10 nm (e.g., from 0.1 nm to 10 nm, 0.2 nm to 10 nm, 0.25 nm to 3 nm, 0.25 nm to one nm, 0.1 nm to 0.5 nm, 0.1 nm to 0.2 nm). As used herein, spot size is determined as follows with reference to FIGS. 19A-19C. An island 1700 formed of gold and having a dimension of from 50 nm to 2000 nm is disposed on a carbon surface 1710. The gold island is formed, for example, by vapor deposition of gold onto the carbon surface. Measurement samples that include gold islands deposited on carbon, suitable for the resolution measurements described herein, are available commercially from Structure Probe Inc. (West Chester, Pa.), for example. The ion microscope is operated such that it moves ion beam 192 linearly across a portion of the gold island, as well as the portions of the carbon surface on one side of the gold island (arrow 1730). The intensity of secondary electrons is measured as a function of the location of the ion beam (FIG. 19C). Asymptotic lines 1740 and 1750 are calculated (or drawn) corresponding to the average total abundance values for the carbon and gold, and vertical lines 1760 and 1770 are calculated (or drawn) corresponding to the locations where the total abundance is 25% and 75%, respectively, of the abundance difference between asymptotic lines 1740 and 1750. The spot size of ion microscope 200 is the distance between lines 1760 and 1770.

In general, the current of ion beam 192 at surface 181 of sample 180 is one nA or less (e.g., 100 pA or less, 50 pA or less), and/or 0.1 fA or more (e.g., one fA or more, 10 fA or more, 50 fA or more, 100 fA or more, one pA or more, 10 pA or more). For example, in some embodiments, the current of ion beam 192 at surface 181 of sample 180 is from 0.1 fA to one nA (e.g., from 10 fA to 100 pA, from 100 fA to 50 pA). In certain embodiments, it can be desirable to use a relatively low beam current when imaging a sample. For example, in some biological and/or pharmaceutical applications, it may be more important to use a low current to image in the sample (e.g., to reduce possible damage to the sample). In such embodiments, one current can be used to prepare the gas field ion microscope for use (e.g., a current of 10 fA or more), and a different current can be used to image the sample (e.g., a current of less than one fA, such as 0.1 fA).

Generally, ion beam 192 has an energy spread at surface 181 of sample 180 of five eV or less (e.g., four eV or less, three eV or less, two eV or less, one eV or less, 0.5 eV or less). In some embodiments, ion beam 192 has an energy spread at surface 181 of sample 180 of 0.1 eV or more (e.g., 0.2 eV or more, 0.3 eV or more, 0.4 eV or more). For example, ion beam 192 can have an energy spread at surface 181 of sample 180 of from 0.1 eV to five eV (e.g., from 0.1 eV to three eV, from 0.1 eV to one eV).

Ion beam 192 can have a relatively high brightness at surface 181 of sample 180. For example, ion beam 192 can have a brightness of $1 \times 10^9$ A/cm$^2$sr (e.g., $1 \times 10^{10}$ A/cm$^2$sr or more, $1 \times 10^{11}$ A/cm$^2$sr or more) at surface 181 of sample 180. In some embodiments, the brightness can be increased by increasing the gas pressure adjacent to tip 186 and/or decreasing the temperature of tip 186. As referred to herein, the brightness of an ion beam is measured as follows. The FWHM of the distribution of ion trajectories in ion beam 192—in a region of space between extractor 190 and first lens 216 where the net electric field is relatively small and the ion trajectories are nearly straight lines—is determined in both the x- and y-directions. A total of 100 ion trajectories that fall within the FWHM width in both the x- and y-directions are chosen at random from the distribution of ion trajectories in ion beam 192. Each of the 100 ion trajectories is nearly a straight line, and is projected back toward tip apex 187. The spatial extent of the trajectories at a particular point $z_t$ along the z-axis is assessed by constructing, in a plane $z_t$ parallel to the x-y plane and passing through point $z_t$, the smallest-diameter circle that encloses all of the points of intersection of the back-propagated trajectories with the plane $z_t$. The diameter of the smallest-diameter circle is $d_{sm}$. Typically, for points $z_t$ closer to tip apex 187, $d_{sm}$ will be smaller and for points $z_t$ closer to sample 180, $d_{sm}$ will be larger. At a particular point $z_t = z_0$, $d_{sm}$ will be a minimum value $d_0$. That is, the spatial extent of the trajectories in a plane parallel to the x-y plane will be a minimum. The diameter $d_0$ of the minimum-diameter circle at point $z_0$ is referred to as the virtual source size of microscope system 200. Next, the divergence and beam current of ion beam 192 in the FWHM region of ion beam 192 between extractor 190 and first lens 216, as discussed above, are measured. Finally, brightness is calculated as beam current divided by the product of the virtual source size and the solid divergence angle of ion beam 192.

Ion beam 192 can have a relatively high reduced brightness at surface 181 of sample 180. For example, ion beam 192 can have a reduced brightness of $5 \times 10^8$ A/m$^2$srV or more (e.g., $1 \times 10^9$ A/cm$^2$srV or more, $1 \times 10^{10}$ A/cm$^2$srV or more) at surface 181 of sample 180. As referred to herein, the reduced brightness of an ion beam is the brightness of the ion beam divided by the average energy of the ions in the ion beam at the position where the beam current is measured Ion beam 192 can have a relatively low etendue at a distal end 193 of extractor 190. For example, ion beam 192 can have an etendue of $5 \times 10^{-21}$ cm or less (e.g., $1 \times 10^{-22}$ cm or less, $1 \times 10^{-23}$ cm$^2$sr or less, $1 \times 10^{-23}$ cm or less, $1 \times 10^{-24}$ cm or less) at distal end 193 of extractor 190. As referred to herein, the etendue of an ion beam is calculated as the mathematical product of the reciprocal of the brightness and the beam current.

Ion beam 192 can have a relatively low reduced etendue at a distal end 193 of extractor 190. For example, ion beam 192 can have a reduced etendue of $1 \times 10^{-16}$ cm or less (e.g., $1 \times 10^{-17}$ cm or less, $1 \times 10^{-18}$ cm or less, $1 \times 10^{-19}$ cm or less) at distal end 193 of extractor 190. Reduced etendue of an ion beam is the mathematical product of the etendue of the ion beam and the ratio of the average energy-to-charge of ions in the ion beam at the position where the beam current is measured.

Ion beam 192 can have a relatively low angular convergence with respect to surface 181 of sample 180. For example, in some embodiments, the convergence half angle of ion beam 192 can be 5 mrad or less (e.g., 1 mrad or less, 0.5 mrad or less, 0.1 mrad or less), and/or 0.05 mrad or more. As referred to herein the convergence half angle of an ion beam is determined as follows. A sample that includes a gold island atop a carbon substrate, as described above, is mounted in ion microscope 200 and translated in the z-direction so that the position of the focus of ion beam 192 lies, as nearly as possible, at the highest elevation point along a diameter of the gold island. Ion beam 192 is then translated linearly along the diameter of the gold island and the focused spot size, $s_f$, of the ion beam is measured, as described above. The sample is then translated in the +z direction, away from ion optics 130, by $s_z = 1$ μm, and ion beam 192 is translated linearly along the same diameter of the gold island to measure the defocused spot size, $s_d$, of ion beam 192. The convergence angle η can then be determined trigonometrically from the measurements of the focused and defocused spot sizes, along with the translation distance, as $$\eta = 2\sin^{-1}\left(\frac{s_d - s_f}{2s_z}\right)$$

The convergence half angle of ion microscope 200 is η/2.

Ion microscope 200 can have a relatively good resolution. For example, in some embodiments, the resolution of ion microscope 200 can be 10 nm or less (e.g., nine nm or less, eight nm or less, seven nm or less, six nm or less, five nm or less, four nm or less, three nm or less, two nm or less, one nm or less). In certain embodiments, the resolution of ion microscope 200 can be 0.05 nm or more (e.g., 0.1 nm or more, 0.2 nm or more, 0.25 nm or more, 0.5 nm or more, 0.75 nm or more, one nm or more, two nm or more, three nm or more). In some embodiments, the resolution of ion microscope 200 can be from 0.05 nm to 10 nm (e.g., from 0.1 nm to 10 nm, 0.2 nm to 10 nm, 0.25 nm to 3 nm, 0.25 nm to one nm, 0.1 nm to 0.5 nm, 0.1 nm to 0.2 nm). As used herein, the resolution of an ion beam refers to the size of the smallest feature that can be reliably measured from images obtained using the ion microscope. A size of a feature is reliably measured if it can be determined to within an error of 10% or less of the actual size of the feature, and with a standard deviation in the measured size of less than 5% of the actual size of the feature, from ten images of the feature obtained under similar conditions.

Ion microscope 200 can be used to take a good quality image in a relatively short period of time. For example, ion microscope 200 can have a quality factor of 0.25 or more (e.g., 0.5 or more, 0.75 or more, one or more, 1.5 or more, two or more). As referred to herein, the quality factor is determined as follows. A planar sample, one half of which is formed of silicon (Si) and the other half of which is formed of copper (Cu), with a boundary between the materials being a straight line across the sample, is positioned so that the boundary is oriented parallel to the y-axis. The sample is imaged pixel-by-pixel by sub-dividing the surface of the sample into an x-y array of 512 pixels by 512 pixels. The dwell time per pixel is 100 ns during the measurement. The total abundance of secondary electrons from the sample is measured as a function of the position of the ion beam on the surface of the sample. For image pixels that correspond to Si in the sample, an average pixel intensity $G_1$ is determined, along with a standard deviation $SD_1$ from the distribution of Si pixel intensities. For image pixels that correspond to Cu in the sample, an average pixel intensity $G_2$ is determined, along with a standard deviation $SD_2$ from the distribution of Cu pixel intensities. The quality factor is calculated according to the equation $$\frac{G_1 - G_2}{\sqrt{SD_1 \cdot SD_2}}$$

Surface 181 of sample 180 can undergo relatively little damage when exposed to ion beam 192. For example, surface 181 of sample 180 can have a value of 25 nm or less (e.g., 20 nm or less, 15 nm or less, 10 nm or less, five nm or less) according to the damage test. As referred to herein, the damage test is performed as follows. An atomically flat silicon (99.99% purity) sample with a four square μm field of view is imaged for 120 seconds while rastering the ion beam across the surface of the sample pixel-by-pixel using an ion beam current at the sample of 10 pA and a spot size of the ion beam at the sample of 10 nm or less. The four square μm field of view is broken into a 512 pixel by 512 pixel array for rastering purposes. The value of the damage test corresponds to the maximum distance of etching into the imaged portion of the silicon sample resulting from performing the damage test.

Ion microscope 200 can have a relatively large depth of focus. For example, in some embodiments, the depth of focus of ion microscope 200 can be five nm or more (e.g., 10 nm or more, 100 nm or more, one μm or more), and/or 200 μm or less (e.g., 100 μm or less, 10 μm or less). In some embodiments, the depth of focus of ion microscope 200 can be from 200 μm to five nm (e.g., from 500 μm to five nm, from one mm to five nm). As used herein, the depth of focus of an ion beam is measured in the following manner. A sample that includes gold islands formed on a carbon substrate (as discussed previously in connection with measurement of the He ion beam spot size) is inserted into the He ion microscope, and a measurement of the He ion beam spot size is performed as discussed above. The location of the sample along the z-axis is iteratively adjusted so that the position of the sample that yields the smallest He ion beam spot size is determined. This position along the z-axis is denoted $z_f$. The spot size of the He ion beam at $z_f$ is denoted $ss_f$. The sample is then translated in increments along the −z direction relative to $z_f$. Spot size measurements of the He ion beam are performed (at the same location on the sample that was used to determine $z_f$) after successive incremental translations. Translation of the sample is halted when the measured He ion beam spot size is $2ss_f$. This position of the sample along the z-axis is denoted $z_u$. Then, the sample is translated in increments along the +z direction relative to $z_u$, and through point $z_f$. Spot size measurements of the He ion beam are performed (at the same location on the sample that was used to determine $z_f$) after successive incremental translations. Translation of the sample is halted when the measured He ion beam spot size is $2ss_f$. This position of the sample along the z-axis is denoted $z_1$. The depth of focus of the He ion microscope, $d_f$, is calculated as $d_f = |z_1 - z_u|$.

In some embodiments, a gas field ion microscope (e.g., He ion microscope) as disclosed herein can be used to distinguish elements in a sample having very close atomic numbers (Z values) using, for example, secondary electron yield, scattered ion abundance, and/or angle- and energy-resolved scattered ion detection. For example, in certain embodiments, the gas field ion microscope can be used to distinguish elements having atomic numbers (Z values) that differ only by one.

In certain embodiments, a gas field ion microscope (e.g., He ion microscope) as disclosed herein can be used to distinguish elements in a sample having a very close masses using, for example, secondary electron yield, scattered ion abundance, and/or angle- and energy-resolved scattered ion detection. In certain embodiments, the gas field ion microscope can be used to distinguish elements having masses that differ by one atomic mass unit or less (e.g., 0.9 atomic mass unit or less, 0.8 atomic mass unit or less, 0.7 atomic mass unit or less, 0.6 atomic mass unit or less, 0.5 atomic mass unit or less, 0.4 atomic mass unit or less, 0.3 atomic mass unit or less, 0.2 atomic mass unit or less, 0.1 atomic mass unit or less). In some embodiments, a sample may have domains formed of materials (e.g., alloys) having different average masses. In such embodiments, the gas field ion microscope can, for example, be used to distinguish domains of material having masses that differ only by one atomic mass unit or less (e.g., 0.9 atomic mass unit or less, 0.8 atomic mass unit or less, 0.7 atomic mass unit or less, 0.6 atomic mass unit or less, 0.5 atomic mass unit or less, 0.4 atomic mass unit or less, 0.3 atomic mass unit or less, 0.2 atomic mass unit or less, 0.1 atomic mass unit or less).

Additional operating parameters that relate to the systems and methods herein as disclosed, for example, by previously-incorporated U.S. patent application Ser. No. 11/600,711 entitled "ION SOURCES, SYSTEMS AND METHODS" by Billy W. Ward et al., filed on Nov. 15, 2006, now published as U.S. Publication No. US 2007/0158558.

Computer Hardware and Software

In general, any of the analysis methods described above can be implemented in computer hardware or software, or a combination of both. The methods can be implemented in computer programs using standard programming techniques following the methods and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis methods can also be implemented as a computer-readable storage medium, configured with a computer program, where the storage medium so configured causes a computer to operate in a specific and predefined manner to perform the functions described herein.

OTHER EMBODIMENTS

While embodiments have been described in which an ion beam is used, more generally, any appropriate charged particle beam can be used. As an example, an electron beam can be used. In some embodiments, an electron beam can be created using a scanning electron microscope. When used with electron beams, the scanning protocols disclosed herein have similar advantages, including reducing sample damage and/or charging that arises from electron beam exposure. Electron beam sources and scanning electron microscope systems are disclosed, for example, in: U.S. Pat. No. 7,186,976 entitled "SCANNING ELECTRON MICROSCOPE"; U.S. Pat. No. 7,105,814 entitled "ELECTRON MICROSCOPY SYSTEM AND ELECTRON MICROSCOPY METHOD"; U.S. Pat. No. 7,285,780 entitled "DETECTOR SYSTEM FOR A SCANNING ELECTRON MICROSCOPE AND A SCANNING ELECTRON MICROSCOPE INCORPORATING SAID DETECTOR SYSTEM"; and U.S. Pat. No. 6,855,938 entitled "OBJECTIVE LENS FOR AN ELECTRON MICROSCOPY SYSTEM AND ELECTRON MICROSCOPY SYSTEM". The entire contents of each of the foregoing U.S. patents are incorporated herein by reference. Other embodiments are in the claims.

What is claimed is:

1. A method, comprising:
   determining a side length $F \cdot \sqrt{A}$ of a smallest square that encloses a region of a sample, wherein A is an area of the region and F is a constant; and
   exposing each of M portions of the region of the sample to a charged particle beam, wherein each of the M portions is exposed continuously to the charged particle beam for a time period $t_1$, a shortest time period between successive exposures of any one of the M portions to the charged particle beam is $t_2$, and the time periods $t_1$ and $t_2$ are selected so that a ratio $$\frac{t_1}{t_1 + t_2}$$

is less than $$\frac{1}{2F\sqrt{M}}.$$

2. The method of claim 1, wherein the ratio $$\frac{t_1}{t_1 + t_2}$$

is less than $$\frac{1}{4F\sqrt{M}}.$$

3. The method of claim 1, wherein the sample and the charged particle beam are positioned within a common chamber having a gas pressure less than $10^{-2}$ Torr, and wherein a plurality of particles leaving the sample are detected by a detector positioned within the common chamber.

4. The method of claim 1, wherein the sample is positioned on a sample mount that permits translation of the sample in a plane orthogonal to a direction of incidence of the charged particle beam, and wherein the mount is configured to permit exchange of the sample for another sample.

5. The method of claim 1, wherein the sample is positioned on a sample mount, and wherein the sample mount is configured to permit adjustment of a distance between the sample and a lens of a charged particle lens system that directs that charged particle beam to be incident on the sample.

6. The method of claim 1, further comprising forming an image of the region based on a plurality of particles leaving the region.

7. The method of claim 6, further comprising displaying the image of the sample to a system operator on an electronic display unit.

8. The method of claim 6, wherein the plurality of particles comprises secondary electrons.

9. The method of claim 6, wherein the plurality of particles comprises at least one member of the group consisting of scattered ions and scattered neutral atoms.

10. The method of claim 6, wherein the plurality of particles comprises photons.

11. The method of claim 1, further comprising exposing the region to an electron source prior to exposing the region to the charged particle beam.

12. The method of claim 1, further comprising exposing the region to an electron source during exposure of the region to the charged particle beam.

13. The method of claim 1, wherein a charged particle current of the charged particle beam is 10 pA or more.

14. The method of claim 13, wherein the charged particle current is 100 pA or more.

15. The method of claim 1, wherein each of the M portions of the region is exposed to the charged particle beam for an exposure time of 100 μs or less.

16. The method of claim 1, wherein a charged particle current of the charged particle beam is 1 pA or more, each of the M portions is exposed to the charged particle beam for an exposure time of 100 μs or less, and an image of the sample is formed over a total acquisition time of 100 seconds or less.

17. The method of claim 1, wherein the charged particle beam comprises noble gas ions.

18. The method of claim 17, wherein the noble gas ions comprise helium ions.

19. The method of claim 1, wherein the charged particle beam comprises electrons.

20. The method of claim 1, wherein the charged particle beam has an energy spread at the surface of the sample of five eV or less.

21. The method of claim 1, wherein a resolution of the image is three nm or less.

22. The method of claim 1, wherein the charged particle beam is produced by a gas field ion microscope having a quality factor of 0.25 or more.

23. The method of claim 1, wherein each of the M portions comprises multiple image pixels.

24. The method of claim 1, further comprising heating the region during exposure to the charged particle beam.

25. The method of claim 1, wherein the charged particle beam has a reduced brightness at a surface of the sample of $5 \times 10^8$ A/m$^2$srV or more.

26. The method of claim 1, wherein determining the side length of the smallest square comprises determining a maximum dimension of the region.

27. The method of claim 1, further comprising exposing, in direct succession, a first plurality of the M portions to the charged particle beam, the first plurality of portions forming a row in a first direction, the charged particle beam having an average spot size f at a surface of the sample, each portion of the first plurality of portions being spaced from its neighboring portions by a distance of at least d in the first direction, and a ratio d/f being 2 or more.

28. The method of claim 27, further comprising exposing, in direct succession, a second plurality of the M portions to the charged particle beam, the second plurality of portions forming a row in the first direction parallel to the row formed by the first plurality of portions, each portion of the second plurality of portions being spaced from its neighboring portions in the second plurality of portions by a distance of at least d in the first direction and being spaced from the first plurality of portions by a distance of at least e in a second direction orthogonal to the first direction.

29. The method of claim 28, wherein e is larger than d.

30. The method of claim 28, wherein f is 5 nm or less, d is 10 nm or more, and e is 10 nm or more.

* * * * *

UNITED STATES PATENT AND TRADEMARK OFFICE
CERTIFICATE OF CORRECTION

PATENT NO. : 8,304,750 B2
APPLICATION NO. : 12/744152
DATED : November 6, 2012
INVENTOR(S) : Dirk Preikszas, Michael Steigerwald and Joerg Ackermann Page 1 of 1

It is certified that error appears in the above-identified patent and that said Letters Patent is hereby corrected as shown below:

Column 10, line 1, delete "$t_c$" insert --$t_e$--

Column 13, line 58, after "scanning" insert --.--

Column 40, line 53, after "measured" insert --.--

Column 40, line 56, delete "$5\times10^{-21}$ cm or less" insert --$5\times10^{-21}$ cm$^2$sr or less--

Column 40, line 56, delete "$1\times10^{-22}$ cm or less" insert --$1\times10^{-22}$ cm$^2$sr or less--

Column 40, line 57, delete "$1\times10^{-23}$ cm$^2$sr or less, $1\times10^{-24}$ cm or less" insert --$1\times10^{-24}$ cm$^2$sr or less--

Column 40, lines 64-65, delete "$1\times10^{-16}$ cm or less (e.g., $1\times10^{-17}$ cm or less, $1\times10^{-18}$ cm or less, $1\times10^{-19}$ cm or less)" insert --$1\times10^{-16}$ cm$^2$sr or less (e.g., $1\times10^{-17}$ cm$^2$sr or less, $1\times10^{-18}$ cm$^2$sr or less, $1\times10^{-19}$ cm$^2$sr or less)--

Signed and Sealed this
Nineteenth Day of February, 2013

Teresa Stanek Rea
*Acting Director of the United States Patent and Trademark Office*